(12) United States Patent
Kim

(10) Patent No.: US 11,645,971 B2
(45) Date of Patent: May 9, 2023

(54) LIGHT EMITTING DIODE PACKAGE AND DISPLAY APPARATUS INCLUDING THE SAME

(71) Applicant: SAMSUNG ELECTRONICS CO., LTD., Suwon-si (KR)

(72) Inventor: Kyoungjun Kim, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/189,635

(22) Filed: Mar. 2, 2021

(65) Prior Publication Data

US 2021/0398479 A1     Dec. 23, 2021

(30) Foreign Application Priority Data

Jun. 23, 2020  (KR) .................. 10-2020-0076757

(51) Int. Cl.
   *G09G 3/32*   (2016.01)
   *H01L 25/16*  (2023.01)
   *H01L 23/00*  (2006.01)

(52) U.S. Cl.
   CPC ............. *G09G 3/32* (2013.01); *H01L 25/162* (2013.01); *H01L 25/167* (2013.01);
   (Continued)

(58) Field of Classification Search
   CPC .......... G09G 3/2007–2014; G09G 3/32–3291; G09G 2300/0439; G09G 2300/0465; G09G 2300/08–0809; G09G 2300/0819; G09G 2300/0842; G09G 2300/0857; G09G 2310/0243; G09G 2310/0264–0275; G09G 2310/0289; G09G 2310/0291–0297; G09G 2310/04; G09G 2310/06; G09G 2310/08; G09G 2320/0233–0242; G09G 2320/0252;
   (Continued)

(56) References Cited

U.S. PATENT DOCUMENTS 6,372,608 B1     4/2002  Shimoda et al.
6,498,592 B1 *  12/2002  Matthies ................. G09G 3/20
                                                        345/55

(Continued)

FOREIGN PATENT DOCUMENTS

JP      2917816 B2     4/1999
JP      2018-72531 A   5/2018
(Continued)

*Primary Examiner* — Nathan Danielsen
(74) *Attorney, Agent, or Firm* — Sughrue Mion, PLLC

(57) ABSTRACT

A light-emitting diode (LED) package includes a first LED pixel including a plurality of first LED chips and a first pixel driving integrated circuit to drive the first LED chips according to an active matrix (AM) mode using entirety of a first frame period, wherein the first pixel driving integrated circuit includes a first storage area configured to store first frame data of each first LED chip, a second storage area configured to store duty ratio compensation data of each first LED chip, a pulse width modulation (PWM) data calculator configured to perform an arithmetic operation on the first frame data and the duty ratio compensation data to generate PWM data, and a PWM data generator configured to adjust an emission duty ratio based on the PWM data.

19 Claims, 19 Drawing Sheets

(52) U.S. Cl.
CPC ..... *G09G 2300/08* (2013.01); *G09G 2310/08* (2013.01); *G09G 2320/0233* (2013.01); *G09G 2320/064* (2013.01); *G09G 2330/04* (2013.01); *G09G 2330/12* (2013.01); *G09G 2360/12* (2013.01); *H01L 24/08* (2013.01); *H01L 24/16* (2013.01); *H01L 24/48* (2013.01); *H01L 2224/08145* (2013.01); *H01L 2224/08225* (2013.01); *H01L 2224/16225* (2013.01); *H01L 2224/48145* (2013.01); *H01L 2224/48227* (2013.01); *H01L 2924/12041* (2013.01); *H01L 2924/14335* (2013.01)

(58) Field of Classification Search
CPC ..... G09G 2320/066; G09G 2340/0442; G09G 2340/14; H01L 24/08; H01L 24/16; H01L 24/48; H01L 25/162; H01L 25/167; H01L 2224/08145; H01L 2224/08225; H01L 2224/16225; H01L 2224/48145; H01L 2224/48227; H01L 2224/12041; H01L 2224/14335

See application file for complete search history.

(56) References Cited

U.S. PATENT DOCUMENTS

| | | | |
|---|---|---|---|
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,253,349 B2 | 8/2012 | Shteynberg et al. |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,686,937 B2 | 4/2014 | Yoo |
| 8,735,931 B2 | 5/2014 | Han et al. |
| 8,766,295 B2 | 7/2014 | Kim |
| 9,591,720 B2 | 3/2017 | Asamura et al. |
| 2012/0044014 A1* | 2/2012 | Stratakos ............... H02J 1/102 |
| | | 327/530 |
| 2012/0200800 A1* | 8/2012 | Kurita ................. G09G 3/3426 |
| | | 349/61 |
| 2014/0139499 A1* | 5/2014 | Hussain ............... G09G 3/3406 |
| | | 345/204 |
| 2014/0312378 A1* | 10/2014 | Hsue ..................... H01L 25/167 |
| | | 438/23 |
| 2017/0330509 A1* | 11/2017 | Cok ..................... G09G 3/2014 |
| 2018/0040271 A1* | 2/2018 | Jung ..................... G09G 3/2007 |
| 2018/0158400 A1 | 6/2018 | Matoba et al. |
| 2020/0312225 A1* | 10/2020 | Hussell ..................... G09G 3/32 |

FOREIGN PATENT DOCUMENTS

| | | |
|---|---|---|
| JP | 2019-113652 A | 7/2019 |
| JP | 2019-113653 A | 7/2019 |
| KR | 10-2008-0048729 A | 6/2008 |
| KR | 10-1306138 B1 | 9/2013 |
| KR | 10-1350410 B1 | 1/2014 |

\* cited by examiner

| | MULTIPLICATION OPERATION COMPENSATION | MATCHING TARGET VALUE | ADDITION OPERATION COMPENSATION | MATCHING TARGET VALUE | STORE DUTY RATIO COMPENSATION COEFFICIENT |
|---|---|---|---|---|---|
| | axk | \| LMT−LMk1 \| < LMS ? | ayk | \| LMT−LMk2 \| < LMS ? | ak |
| 210 — FIRST LED CHIP | ax1 | YES | – | – | a1=ax1 |
| 220 — SECOND LED CHIP | ax2 | NO | ay2 | YES | a2=ay2 |
| 230 — THIRD LED CHIP | ax3 | YES | – | – | a3=ax3 |

LIGHT EMITTING DIODE PACKAGE AND DISPLAY APPARATUS INCLUDING THE SAME

CROSS-REFERENCE TO THE RELATED APPLICATION

This application claims priority to Korean Patent Application No. 10-2020-0076757, filed on Jun. 23, 2020, in the Korean Intellectual Property Office, the disclosure of which is incorporated herein by reference in its entirety.

BACKGROUND

1. Field

Methods, apparatuses and systems consistent with example embodiments relate to a light-emitting diode (LED) package and a display apparatus including the same, and more particularly, to an LED package including a pixel driving integrated circuit and a display apparatus including the LED package.

2. Related Art

LEDs are being used as a light source for various electronic products, in addition to a light source for lighting devices. Particularly, LEDs are being widely used as a light source for various kinds of display apparatuses included in televisions (TVs), portable phones, personal computers (PCs), notebook PCs, tablet PCs, wearable devices, electronic signboards, etc.

In this related art, display apparatuses including a liquid crystal display panel and a backlight have been used. However, recently LED displays which include three small LED chips configure one pixel have been proposed. LED displays do not need a separate backlight, and thus, are easy to be highly integrated and have better light efficiency than liquid crystal display (LCD) apparatuses. Also, by changing the arrangement of LED chips, an aspect ratio of a screen may be freely selected and a large-area screen may be implemented, thereby providing various types of display apparatuses.

SUMMARY

Example embodiments provide a light-emitting diode (LED) package and a display apparatus including the same, in which the reliability of an operation is increased even when a low-luminance operation is performed, and luminance non-uniformity is prevented, thereby realizing excellent screen quality.

According to an aspect of an example embodiment, an LED package includes: a first LED pixel including a plurality of first LED chips; and a first pixel driving integrated circuit configured to drive the plurality of first LED chips according to an active matrix (AM) mode using entirety of a first frame period. The first pixel driving integrated circuit includes: a first storage area configured to store first frame data of each of the plurality of first LED chips; a second storage area configured to store duty ratio compensation data of each of the plurality of first LED chips; a pulse width modulation (PWM) data calculator configured to perform an arithmetic operation on the first frame data provided from the first storage area and the duty ratio compensation data provided from the second storage area to generate PWM data; and a PWM data generator configured to adjust an emission duty ratio based on the PWM data.

According to an aspect of another example embodiment, an LED package includes a first LED pixel including a plurality of first LED chips; a first pixel driving integrated circuit configured to drive the plurality of first LED chips based on an AM PWM mode of controlling a time for which a driving current is applied thereto in a first frame period; and a package substrate on which the plurality of first LED chips and the first pixel driving integrated circuit are disposed. The first pixel driving integrated circuit includes: a deserializer configured to receive serial data from an external controller, extract and store first frame data of each of the plurality of first LED chips from the serial data, and provide the first frame data; a first storage area configured to store the first frame data provided from the deserializer; a second storage area configured to store duty ratio compensation data of each of the plurality of first LED chips; a PWM data calculator configured to perform an arithmetic operation on the first frame data provided from the first storage area and the duty ratio compensation data provided from the second storage area to generate PWM data; a constant current generator configured to generate a reference current based on a source voltage; a PWM data generator configured to generate a plurality of first driving currents applied to the plurality of first LED chips based on a clock signal, a PWM clock signal, the PWM data provided from the PWM data calculator, and the reference current provided from the constant current generator; a data input pad configured to receive the serial data; a data output pad configured to output data, other than the first frame data, of the serial data; a power pad configured to receive the source voltage; a first clock pad configured to receive the clock signal; a second clock pad configured to receive the PWM clock signal; and a ground pad connected to the plurality of first LED chips.

According to an aspect of another example embodiment, a display apparatus includes a printed circuit board; a plurality of light-emitting diode (LED) packages disposed on a first surface of the printed circuit board; and a controller disposed on a second surface opposite to the first surface of the printed circuit board, the controller being configured to control driving of the plurality of LED packages. Each of the plurality of LED packages includes: a first LED pixel including a plurality of first LED chips; and a first pixel driving integrated circuit configured to drive the plurality of first LED chips based on an active matrix (AM) mode using entirety of a first frame period. The first pixel driving integrated circuit includes: a first storage area configured to store first frame data of each of the plurality of first LED chips; a second storage area configured to store duty ratio compensation data of each of the plurality of first LED chips; a pulse width modulation (PWM) data calculator configured to perform an arithmetic operation on the first frame data provided from the first storage area and the duty ratio compensation data provided from the second storage area to generate PWM data; and a PWM data generator configured to adjust an emission duty ratio based on the PWM data.

BRIEF DESCRIPTION OF THE DRAWINGS

The above and other objects and features will become more apparent from the following description of example embodiments with reference to the accompanying drawings in which.

DETAILED DESCRIPTION

Figure 1:
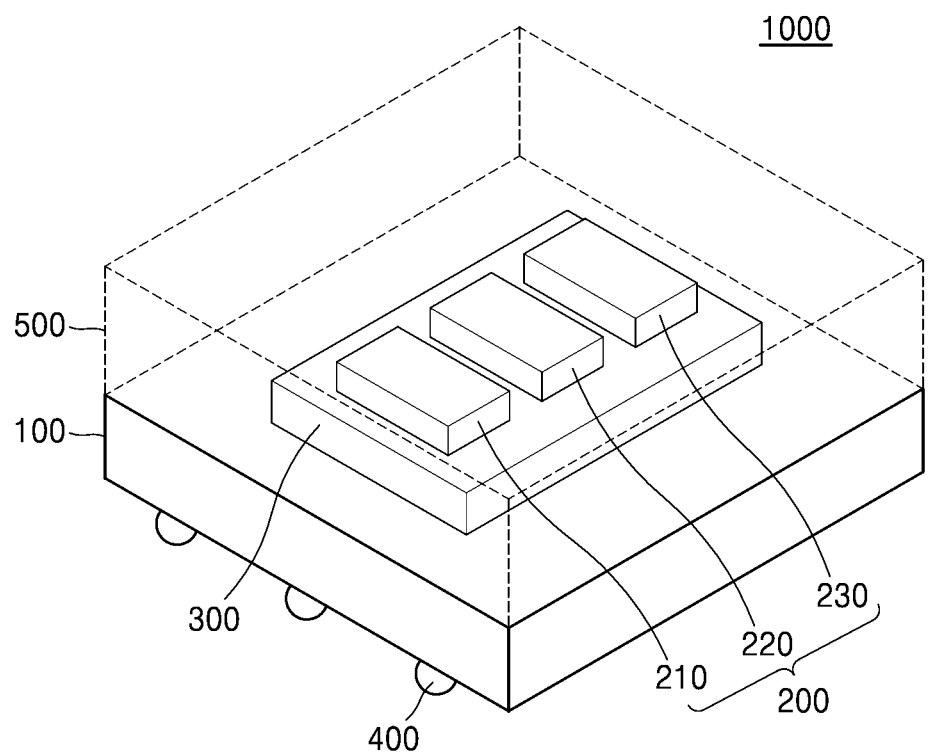
FIG. 1 is a perspective view illustrating a light-emitting diode (LED) package according to example embodiments.

FIG. 1 is a perspective view illustrating a light-emitting diode (LED) package 1000 according to example embodiments.

Referring to FIG. 1, the LED package 1000 may include an LED pixel and a pixel driving integrated circuit 300. The LED pixel may include a plurality of LED chips 200 mounted on the pixel driving integrated circuit 300, and the LED chips 200 and the pixel driving integrated circuit 300 may be mounted on a package substrate 100. An external connection terminal 400 such as a solder or a bump may be connected to a lower portion of the package substrate 100, and a sealing member 500 covering the LED chips 200 and the pixel driving integrated circuit 300 may be further provided.

In some example embodiments, the LED chips 200 may include first to third LED chips 210 to 230 disposed on the pixel driving integrated circuit 300, and the first to third LED chips 210 to 230 may emit light having different colors. For example, the first LED chip 210 may emit red light, the second LED chip 220 may emit green light, and the third LED chip 230 may emit blue light. In this case, the LED package 1000 may be a red, blue, green (RGB) package for full color.

In some example embodiments, the first to third LED chips 210 to 230 may emit light having the same color. For example, each of the first to third LED chips 210 to 230 may be an LED chip which emits white light. In this case, the LED package 1000 may be a multi white package for vivid color.

In some other example embodiments, colors of light emitted from the first to third LED chips 210 to 230 may further include at least one of various colors such as cyan, yellow, and magenta.

The LED chips 200 may be disposed on a top surface of the pixel driving integrated circuit 300, and thus, light emitted from the LED chips 200 may not be blocked by the pixel driving integrated circuit 300.

The pixel driving integrated circuit 300 may be disposed under the LED chips 200, and the LED chips 200 may be driven based on an active matrix (AM) mode. Here, the AM mode refer to an addressing method applied to flat display apparatuses. In a display apparatus driven based on the AM mode, each of pixels may include a storage element (for example, a capacitor) for driving a corresponding pixel and a transistor which is programmable for each signal. Pixels included in one scan line may be programmed for a certain time (a frame time/the number of scan lines) on the basis of an external signal. Also, a capacitor included in each of the pixels may hold a voltage of a corresponding pixel, and thus, each pixel may continuously emit light for the other time of a frame. In a process of displaying a moving image by using a display apparatus, a motion may be cut at a certain time interval and may be continuously displayed, and in this case, a time interval corresponding to one scene may be referred to as a frame time.

The pixel driving integrated circuit 300 may drive the LED chips 200 on the basis of a pulse width modulation (PWM) mode of a multimode. The pixel driving integrated circuit 300 may adjust a pulse width of a driving current (i.e., an application time of the driving current) flowing through the LED chips 200 during one frame period, for controlling the luminance of the LED chips 200.

The pixel driving integrated circuit 300 may drive the LED chips 200 by performing a duty ratio compensation operation of compensating for a luminance characteristic of each of the LED chips 200. For example, the duty ratio compensation operation may be performed by using one of a first mode and a second mode. The first mode may be a mode for performing a multiplication operation on first frame data of each of the LED chips 200 and duty ratio compensation data of each of the LED chips 200, and the second mode may be a mode for performing an addition operation on the first frame data of each of the LED chips 200 and the duty ratio compensation data of each of the LED chips 200.

In example embodiments, the duty ratio compensation operation may be performed by using one of the first mode and the second mode on the basis of the duty ratio compensation data obtained based on a luminance characteristic value of each of the LED chips 200. For example, when one of the LED chips 200 has luminance which is lower than target luminance, the duty ratio compensation data may include duty ratio compensation information for the first mode (i.e., a multiplication operation). When one of the LED chips 200 has low luminance in a low grayscale or has an abnormal turn-on problem, such as flickering, the duty ratio compensation data may include duty ratio compensation information for the second mode (i.e., an addition operation). A method of calculating duty ratio compensation data on the basis of the luminance characteristic value of each of the LED chips 200 will be described below in detail with reference to FIGS. 6A to 6D.

In example embodiments, a duty ratio compensation operation may be performed on all of the first to third LED chips 210 to 230 by using the first mode. In other example embodiments, a duty ratio compensation operation may be performed on all of the first and second LED chips 210 and 220 by using the first mode, and a duty ratio compensation operation may be performed on the third LED chip 230 by using the second mode. In other example embodiments, a duty ratio compensation operation may be performed on all of the first and third LED chips 210 and 230 by using the first mode, and a duty ratio compensation operation may be performed on the second LED chip 220 by using the second mode. A driving method based on a duty ratio compensation operation of the pixel driving integrated circuit 300 will be described below in detail with reference to FIGS. 3 to 5 and 6A to 6D.

The pixel driving integrated circuit 300 may be electrically connected to the package substrate 100, on the package substrate 100. For example, various wiring structures including a through silicon via (TSV) may be disposed in the pixel driving integrated circuit 300. The pixel driving integrated circuit 300 may be configured to be electrically connected to the package substrate 100 through a connection terminal such as a solder or a conductive bump. The pixel driving integrated circuit 300 may include a plurality of pads for connecting the package substrate 100 to the pixel driving integrated circuit 300. The plurality of pads may be provided on a bottom surface of the pixel driving integrated circuit 300. The plurality of pads may include a data input pad 311 (see FIG. 2), a data output pad 312 (see FIG. 2), a power pad 313 (see FIG. 2), a plurality of clock pads 314 and 315 (see FIG. 2), and a ground pad 316 (see FIG. 2).

In the example embodiment of FIG. 1, the LED chips 200 may be implemented as a flip chip type. In detail, the LED chips 200 may be connected to the pixel driving integrated circuit 300 through at least one electrode. Also, the pixel driving integrated circuit 300 under the LED chips 200 may include at least one pad for an electrical connection with the LED chips 200. The LED chips 200 may be electrically connected to the pixel driving integrated circuit 300 by a conductive adhesive material such as eutectic metal, paste, or a solder.

Figure 16:
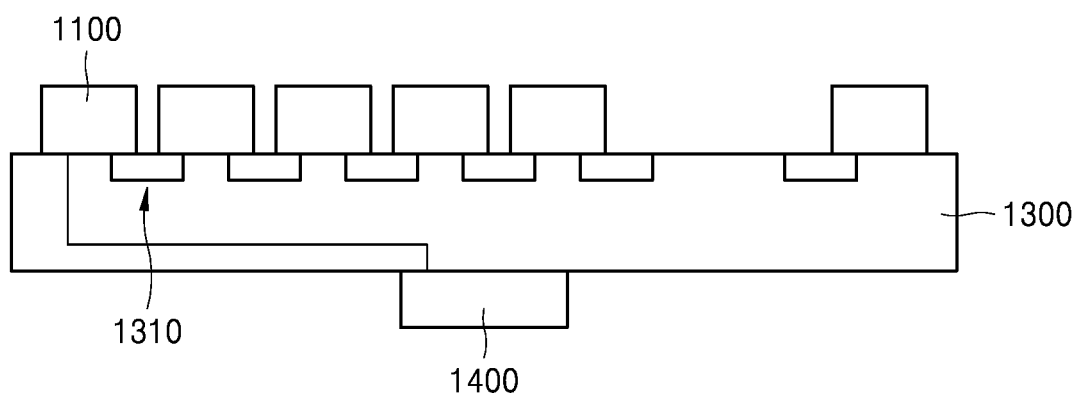
FIG. 16 is a cross-sectional view of the display apparatus of FIG. 14.

The LED chips 200 and the pixel driving integrated circuit 300 may be mounted on the package substrate 100 and may communicate with an external controller 1400 (see FIG. 16) through the package substrate 100 and an external printed circuit board (PCB) 1300 (see FIG. 16).

The package substrate 100 may include a plurality of pads for an electrical connection with the pixel driving integrated circuit 300. The plurality of pads of the package substrate 100 may include a data input pad, a clock pad, a power pad, a data output pad, and a ground pad and may be disposed between the package substrate 100 and the pixel driving integrated circuit 300 so as not to be exposed. An adhesive member such as epoxy, silicone, acrylate, or paste for fixing the plurality of pads therebetween may be disposed between the pixel driving integrated circuit 300 and the package substrate 100.

The LED chips 200 and the pixel driving integrated circuit 300 may be fixed on the package substrate 100 by the sealing member 500 having light-transmitting properties. The sealing member 500 may include an epoxy resin and a silicone resin. The sealing member 500 may further include a filler such as fused silica or carbon black.

According to example embodiments, the pixel driving integrated circuit 300 may perform a duty ratio compensation operation through a multiplication operation or an addition operation on the basis of the luminance characteristic value of each of the first to third LED chips 210 to 230. Therefore, even when the first to third LED chips 210 to 230 have different luminance characteristic values, light having uniform luminance may be emitted from the LED package 1000. In other words, in terms of binning of the LED chips 200, even when the LED package 1000 is manufactured by using the LED chips 200 having a relatively large luminance deviation, the LED package 1000 may emit light having good quality (or uniform luminance), thereby decreasing the manufacturing cost of the LED package 1000. Moreover, the LED package 1000 may enable a display apparatus to display an image where a luminance deviation is compensated for in a grayscale, and thus may increase image quality and may prevent flickering in a low grayscale, thereby increasing the reliability of an operation of a display apparatus including the LED package 1000.

Figure 2:
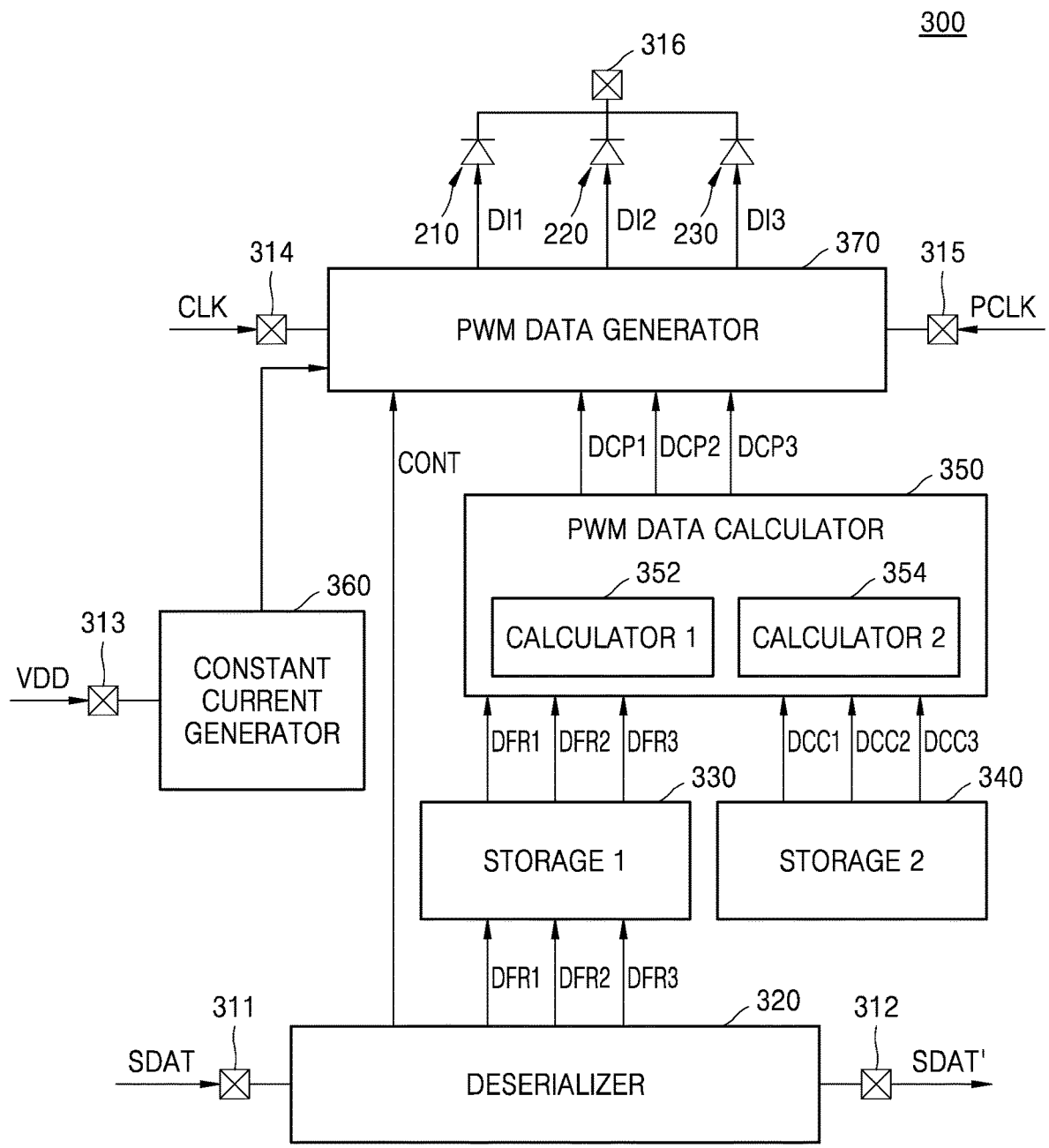
FIG. 2 is a circuit diagram for describing a pixel driving integrated circuit of FIG. 1.

FIG. 2 is a circuit diagram for describing the pixel driving integrated circuit 300 of FIG. 1.

Referring to FIG. 2, the pixel driving integrated circuit 300 may include a plurality of pads 311 to 316, a deserializer 320, a first storage area 330, a second storage area 340, a PWM data calculator 350, a constant current generator 360, and a PWM data generator 370.

The deserializer 320 may receive serial data SDAT from the external controller 1400 (see FIG. 16) through the data input pad 311, extract and store first frame data of the LED chips 200 from the serial data SDAT, and distribute and output the frame data.

In some example embodiments, the first frame data may include pieces of frame data DFR1, DFR2, and DFR3 of the LED chips 200 and control data CONT for controlling the PWM data generator 370. The control data CONT may include a command and clock match data. For example, the pieces of frame data DFR1, DFR2, and DFR3 may include grayscale data of an image signal and may further include additional grayscale data to correct undesirable low efficiency and/or wavelength shift for a certain pixel.

The deserializer 320 may output serial data SDAT' other than frame data corresponding to a corresponding pixel driving integrated circuit 300 among the serial data SDAT without separate processing. The serial data SDAT' may be output through the data output pad 312 and may be provided to a subsequent LED package (for example, an LED package of a next scan line). In a display apparatus 2000 (see FIG. 14), a plurality of LED packages may be serially connected to one another, and serial data SDAT corresponding to one frame period may include pieces of frame data of a plurality of LED packages.

For example, an LED package of a first scan line may obtain only frame data thereof and may output the other data to an LED package of a second scan line, and the LED package of the second scan line may obtain only frame data thereof and may output the other data to an LED package of a third scan line. In this manner, LED packages of first to last scan lines may each obtain frame data thereof.

The first storage area 330 may store pieces of frame data DFR1, DFR2, and DFR3 which are data for respectively driving the first to third LED chips 210 to 230. The first storage area 330 may store the pieces of frame data DFR1, DFR2, and DFR3 provided from the deserializer 320 and may output the pieces of frame data DFR1, DFR2, and DFR3 to the PWM data calculator 350.

In example embodiments, the first storage area 330 may be implemented in the form of a latch, a register, or a buffer and may include at least one of volatile memories such as static random access memory (SRAM) and dynamic random access memory (DRAM) and/or non-volatile memories such as electrically erasable programmable read-only memory (EEPROM), flash memory, phase change random access memory (PRAM), resistance random access memory (RRAM), nano floating gate memory (NFGM), polymer random access memory (PoRAM), magnetic random access memory (MRAM), and ferroelectric random access memory (FRAM).

The second storage area 340 may store pieces of duty ratio compensation data DCC1, DCC2, and DCC3 respectively including duty ratio compensation coefficients of the first to third LED chips 210 to 230 and may output the pieces of duty ratio compensation data DCC1, DCC2, and DCC3 to the PWM data calculator 350. The pieces of duty ratio compensation data DCC1, DCC2, and DCC3 may respectively include duty ratio compensation coefficients a1, a2, and a3 (see FIG. 4) calculated based on the luminance characteristic values of the first to third LED chips 210 to 230. Also, the pieces of duty ratio compensation data DCC1, DCC2, and DCC3 may include information which is calculated based on the luminance characteristic values of the first to third LED chips 210 to 230, for determining a mode (for example, the first mode or the second mode) of a duty ratio compensation operation.

In example embodiments, the second storage area 340 may be implemented in the form of a latch, a register, or a buffer and may include at least one of volatile memories such as SRAM and DRAM and/or non-volatile memories such as EEPROM, flash memory, PRAM, RRAM, NFGM, PoRAM, MRAM, and FRAM.

The PWM data calculator 350 may perform a duty ratio compensation operation on the basis of the pieces of frame data DFR1, DFR2, and DFR3 provided from the first storage area 330 and the pieces of duty ratio compensation data DCC1, DCC2, and DCC3 provided from the second storage area 340 to generate pieces of PWM data DCP1, DCP2, and DCP3 and may output the pieces of PWM data DCP1, DCP2, and DCP3 to the PWM data generator 370.

In example embodiments, the PWM data calculator 350 may include a first calculator 352 and a second calculator 354. The PWM data calculator 350 may perform a duty ratio compensation operation on the basis of one of the first mode and the second mode. The first mode may be an operation mode of performing a multiplication operation on the pieces of frame data DFR1, DFR2, and DFR3 provided from the first storage area 330 and the pieces of duty ratio compensation data DCC1, DCC2, and DCC3 provided from the second storage area 340. The first mode may be performed by the first calculator 352, and the first calculator 352 may include a shifter for a multiplication operation. The second mode may be an operation mode of performing an addition operation on the pieces of frame data DFR1, DFR2, and DFR3 provided from the first storage area 330 and the pieces of duty ratio compensation data DCC1, DCC2, and DCC3 provided from the second storage area 340. The second mode may be performed by the second calculator 354, and the second calculator 354 may include an adder for an addition operation.

For example, the pieces of duty ratio compensation data DCC1, DCC2, and DCC3 provided from the second storage area 340 to the PWM data calculator 350 may include k-bits (where k is a natural number of 4 or more) data. The pieces of duty ratio compensation data DCC1, DCC2, and DCC3 may include data of 1 bit for selecting one mode from among the first mode and the second mode and data of k-1 bits indicating a duty ratio compensation coefficient on the basis of the luminance characteristic values of the LED chips 200. Here, the data of 1 bit for selecting the one mode from among the first mode and the second mode may be referred to as a mode selection bit MDS (see FIG. 4).

For example, the duty ratio compensation data DCC1 for the first LED chip 210 may include a mode selection bit MDS (for example, data "0") indicating a duty ratio compensation operation of the first mode, and in this case, the first calculator 352 of the PWM data calculator 350 may perform a multiplication operation on the frame data DFR1 provided from the first storage area 330 and the duty ratio compensation data DCC1 provided from the second storage area 340 to generate the PWM data DCP1 and may output the PWM data DCP1 to the PWM data generator 370.

For example, the duty ratio compensation data DCC2 for the second LED chip 220 may include a mode selection bit MDS (for example, data "1") indicating a duty ratio compensation operation of the second mode, and in this case, the second calculator 354 of the PWM data calculator 350 may perform an addition operation on the frame data DFR2 provided from the first storage area 330 and the duty ratio compensation data DCC2 provided from the second storage area 340 to generate the PWM data DCP2 and may output the PWM data DCP2 to the PWM data generator 370.

The constant current generator 360 may receive a source voltage VDD through the power pad 313 and may generate a reference current on the basis of the source voltage VDD. For example, the constant current generator 360 may include a current mirror.

The PWM data generator 370 may generate a plurality of driving currents DI1, DI2, and DI3 applied to the first to third LED chips 210 to 230 on the basis of a clock signal CLK received through the first clock pad 314, a PWM clock signal PCLK received through the second clock pad 315, the control data CONT provided from the deserializer 320, the pieces of PWM data DCP1, DCP2, and DCP3 provided from the PWM data calculator 350, and the reference current provided from the constant current generator 360.

The driving currents DI1, DI2, and DI3 may be generated based on the PWM mode. For example, a pulse width (for example, an application time of the driving current DI1) of the driving current DI1 applied to the first LED chip 210 may be adjusted based on the PWM data DCP1, a pulse width of the driving current DI2 applied to the second LED chip 220 may be adjusted based on the PWM data DCP2, and a pulse width of the driving current DI3 applied to the third LED chip 230 may be adjusted based on the PWM data DCP3.

For example, the clock signal CLK for driving the PWM data generator 370 may have a first frequency, and the PWM clock signal PCLK for modulating the PWM may have a second frequency which is higher than the first frequency, for precisely adjusting pulse widths of the driving currents DI1, DI2, and DI3.

In some example embodiments, a unit emission time of each of the first to third LED chips 210 to 230 may be equal to or greater than a period of the PWM clock signal PCLK. In some example embodiments, the unit emission time of each of the first to third LED chips 210 to 230 may be N (where N is an integer of 2 or more) times the period of the PWM clock signal PCLK. For example, the unit emission time of each of the first to third LED chips 210 to 230 may be a multiple of the period of the PWM clock signal PCLK.

Each of the first to third LED chips 210 to 230 may include an anode electrode, which receives a corresponding driving current of the driving currents DI1, DI2, and DI3 from the PWM data generator 370, and a cathode electrode connected to the ground pad 316 which provides a ground voltage GND.

FIGS. 3 to 5 and 6A to 6D are diagrams for describing an operation of the pixel driving integrated circuit of FIG. 2.

Figure 3:
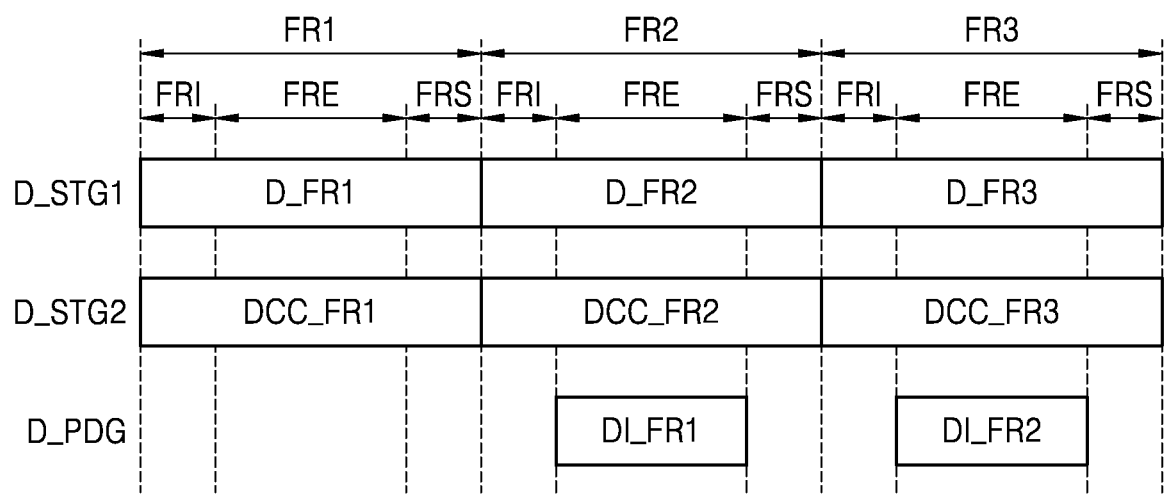
FIGS. 3 to 5, 6A, 6B, 6C and 6D are diagrams for describing an operation of the pixel driving integrated circuit of FIG. 2.

FIG. 3 is a timing diagram showing data D_STG1 stored in the first storage area 330, data D_STG2 stored in the second storage area 340, and data D_PDG stored in the PWM data generator 370, in one frame period of the pixel driving integrated circuit 300.

Referring to FIGS. 2 and 3, the pixel driving integrated circuit 300 may drive the first to third LED chips 210 to 230 in the AM mode which entirely uses one frame period. The pixel driving integrated circuit 300 may perform a duty ratio compensation operation on the basis of the data D_STG1 stored in the first storage area 330 and the data D_STG2 stored in the second storage area 340 to calculate the data D_PDG stored in the PWM data generator 370, a first frame period FR1, a second frame period FR2, and a third frame period FR3 which are sequentially connected to one another.

For example, the first to third frame periods FR1, FR2, and FR3 may each include an initial period FRI, an emission period FRE, and a reset period FRS.

In the first frame period FR1, during the emission period FRE, the pixel driving integrated circuit 300 may receive and distribute the first frame data D_FR1, and the first storage area 330 may store the first frame data D_FR1. Also, during the emission period FRE, the second storage area 340 may store duty ratio compensation data DCC_FR1 of each of the first to third LED chips 210 to 230. In the first frame period FR1, the PWM data generator 370 may not generate a driving current, and thus, the first to third LED chips 210 to 230 may not emit light. For example, the PWM data generator 370 may not generate the data D_PDG in the first frame period FR1.

In the second frame period FR2 after the first frame period FR1, during the initial period FRI, the first frame data D_FR1 stored in the first storage area 330 may be provided to the PWM data calculator 350, and the duty ratio compensation data DCC_FR1 stored in the second storage area 340 may be provided to the PWM data calculator 350. The PWM data calculator 350 may perform a duty ratio compensation operation on the first frame data D_FR1 and the duty ratio compensation data DCC_FR1 (for example, the first calculator 352 may perform a multiplication operation, or the second calculator 354 may perform an addition operation), and thus, the PWM data generator 370 may generate the driving current DI_FR1 on the basis of a result obtained by performing the duty ratio compensation operation. During the emission period FRE of the second frame period FR2, the first to third LED chips 210 to 230 may emit light on the basis of the driving current DI_FR1.

In the second frame period FR2, during the emission period FRE, the pixel driving integrated circuit 300 may receive and distribute the second frame data D_FR2, and the first storage area 330 may store the second frame data D_FR2. In the third frame period FR3 after the second frame period FR2, during the initial period FRI, the PWM data calculator 350 may perform a duty ratio compensation operation on the second frame data D_FR2 stored in the first storage area 330 and the duty ratio compensation data DCC_FR2 stored in the second storage area 340 (for example, the first calculator 352 may perform a multiplication operation, or the second calculator 354 may perform an addition operation), and thus, the PWM data generator 370 may generate the driving current DI_FR2 on the basis of a result obtained by performing the duty ratio compensation operation. During the emission period FRE of the third frame period FR3, the first to third LED chips 210 to 230 may emit light on the basis of the driving current DI_FR2. Likewise, during the emission period FRE of the third frame period FR3, the pixel driving integrated circuit 300 may receive and distribute the third frame data D_FR3, and the first storage area 330 may store the third frame data D_FR3, and the second storage area 340 may store the duty ratio compensation data DCC_FR3.

Figure 4:
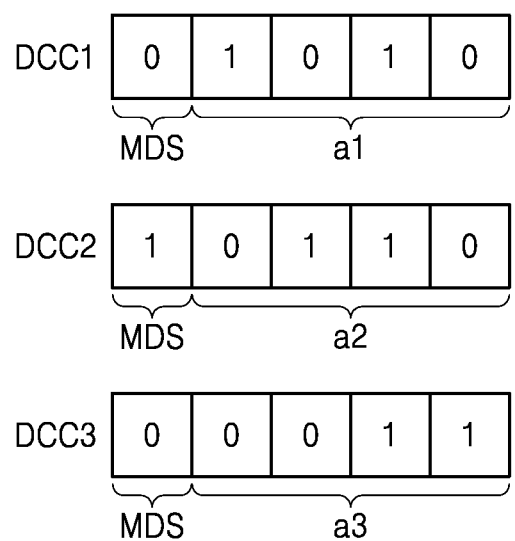

FIG. 4 is a schematic diagram illustrating a configuration of each of pieces of duty ratio compensation data DCC1, DCC2, and DCC3.

Referring to FIG. 4, the pieces of duty ratio compensation data DCC1, DCC2, and DCC3 provided from the second storage area 340 to the PWM data calculator 350 may include data of k bits (where k is a natural number of 4 or more). The pieces of duty ratio compensation data DCC1, DCC2, and DCC3 may include data of 1 bit for selecting one mode from among the first mode and the second mode and data of k−1 bits including a duty ratio compensation coefficient on the basis of the luminance characteristic values of the LED chips 200. Here, the data of 1 bit for selecting one mode from among the first mode and the second mode may be referred to as a mode selection bit MDS.

As illustrated in FIG. 4, when the pieces of duty ratio compensation data DCC1, DCC2, and DCC3 include data of 5 bits, each of the pieces of duty ratio compensation data DCC1, DCC2, and DCC3 may include data of 1 bit corresponding to a mode selection bit MDS and data of 4 bits corresponding to duty ratio compensation coefficients a1, a2, and a3. However, the number of bits of the mode selection bit MDS is not limited to the illustration of FIG. 4, and the mode selection bit MDS may be implemented with 2 bits or more. Also, the number of bits of the duty ratio compensation coefficients a1, a2, and a3 is not limited to the illustration of FIG. 4, and the duty ratio compensation coefficients a1, a2, and a3 may each be implemented with fewer bits or more bits.

Figure 5:
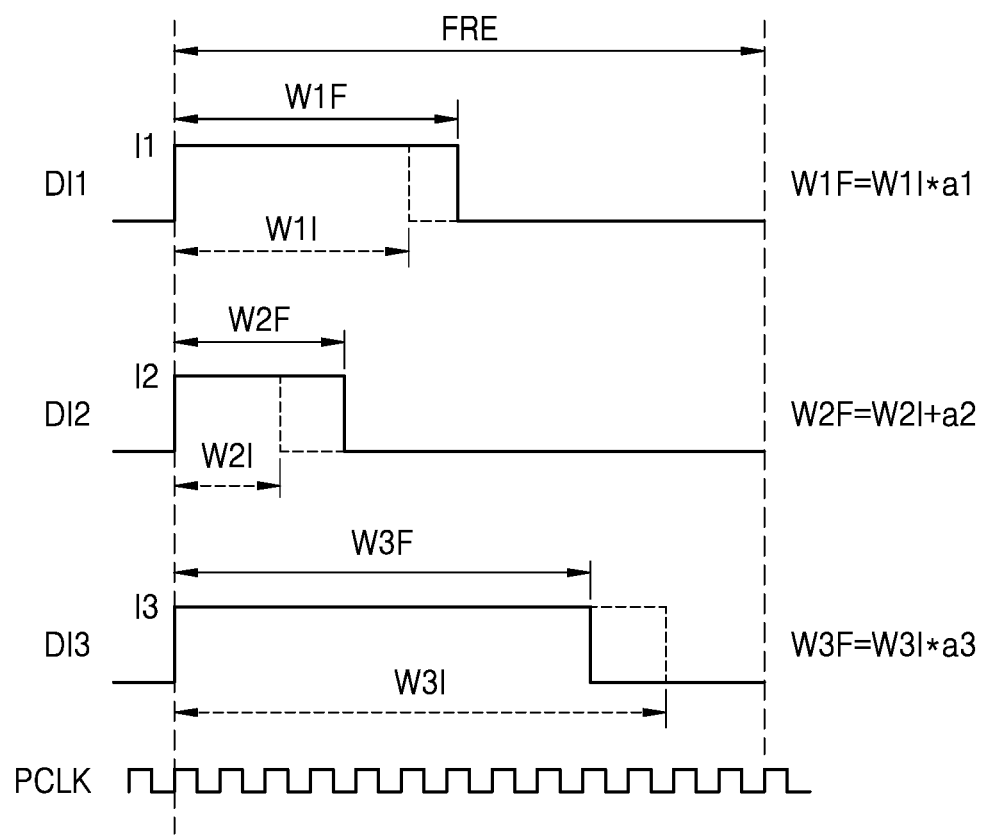

FIG. 5 is a timing diagram showing a plurality of driving currents DI1, DI2, and DI3 applied to the first to third LED chips 210 to 230.

Referring to FIG. 5, the driving current DI1 applied to the first LED chip 210 may have a first level I1 and a first pulse width W1F, the driving current DI2 applied to the second LED chip 220 may have a second level I2 and a second pulse width W2F, and the driving current DI3 applied to the third LED chip 230 may have a third level I3 and a third pulse width W3F. As a width of a driving current increases, the LED chips 200 may emit light having a higher grayscale (or luminance).

The driving current DI1 applied to the first LED chip 210 may have the first level I1 and the first pulse width W1F, and thus, the first LED chip 210 may emit light for a first time period corresponding to the first pulse width W1F. For example, the first pulse width W1F may be a pulse width (an application time) obtained by performing a multiplication operation on a first input pulse width W1I and a first duty ratio compensation coefficient a1. For example, the first frame data DFR1 stored in the first storage area 330 may include information about the first input pulse width W1I, and the duty ratio compensation data DCC1 stored in the second storage area 340 may include information about the first duty ratio compensation coefficient a1 and information about a multiplication operation. When the first LED chip 210 has a luminance characteristic which is lower than target luminance, the first duty ratio compensation coefficient a1 may have a value which is greater than 1. Therefore, the first LED chip 210 may emit light for the first time period corresponding to the first pulse width W1F obtained by performing a multiplication operation on the first duty ratio compensation coefficient a1 and the first input pulse width W1I of the first LED chip 210, and the first LED chip 210 may have luminance corresponding to (or similar to the target luminance) the target luminance. As the first duty ratio compensation coefficient a1 has the value which is greater than 1, the first pulse width W1F may be wider than the first input pulse width W1I, and the first LED chip 210 may be compensated to have a relatively brighter luminance.

Similarly, the driving current DI2 applied to the second LED chip 220 may have a second level I2 and a second pulse width W2F, and thus, the second LED chip 220 may emit light for a second time period corresponding to the second pulse width W2F. For example, the second pulse width W2F may be a pulse width (an application time) obtained by performing an addition operation on a second input pulse width W2I and a second duty ratio compensation coefficient a2. For example, the frame data DFR2 stored in the first storage area 330 may include information about the second input pulse width W2I, and the duty ratio compensation data DCC2 stored in the second storage area 340 may include information about the second duty ratio compensation coefficient a2 and information about an addition operation. The second LED chip 220 may be configured so that duty ratio compensation is performed based on the second duty ratio compensation coefficient a2 and an addition operation when a flickering phenomenon such as unstable flickering occurs in the second LED chip 220 in a low grayscale. Therefore, the second LED chip 220 may emit light for the second time period corresponding to the second pulse width W2F obtained by performing an addition operation on the second duty ratio compensation coefficient a2 and the second input pulse width W2I of the second LED chip 220, and the second LED chip 220 may have luminance corresponding to (or similar to the target luminance) the target luminance and may prevent unstable flickering in the low grayscale. As the second duty ratio compensation coefficient a2 is being added to the second input pulse width W2I, the second pulse width W2F may be wider than the second input pulse width W2I, and the second LED chip 220 may be compensated to have a relatively brighter luminance.

Similarly, the driving current DI3 applied to the third LED chip 230 may have a third level I3 and a third pulse width W3F, and thus, the third LED chip 230 may emit light for a third time period corresponding to the third pulse width W3F. For example, the third pulse width W3F may be a pulse width (an application time) obtained by performing a multiplication operation on a third input pulse width W3I and a third duty ratio compensation coefficient a3. For example, the frame data DFR3 stored in the first storage area 330 may include information about the third input pulse width W3I, and the duty ratio compensation data DCC3 stored in the second storage area 340 may include information about the third duty ratio compensation coefficient a3 and information about a multiplication operation. When the third LED chip 230 has a luminance characteristic which is higher than the target luminance, the third duty ratio compensation coefficient a3 may have a value which is less than 1. Therefore, the third LED chip 230 may emit light for the third time period corresponding to the third pulse width W3F obtained by performing a multiplication operation on the third duty ratio compensation coefficient a3 and the third input pulse width W3I of the third LED chip 230, and the third LED chip 230 may have luminance corresponding to (or similar to the target luminance) the target luminance. As the third duty ratio compensation coefficient a3 has the value which is less than 1, the third pulse width W3F may be narrower than the third input pulse width W3I, and the third LED chip 230 may be compensated to have a relatively dimmer luminance.

In embodiments, the first level I1, the second level I2, and the third level I3 may be the same. Due to a process distribution and a wavelength difference between emitted light, the first to third LED chips 210 to 230 may have different luminance characteristics with respect to a forward voltage Vf and a current and may differ in wavelength shift. Therefore, it may be difficult to apply a PWM mode of controlling a level of a current to adjust a grayscale, and when a PWM mode of controlling an emission time to adjust a grayscale in a state where a level of a current is fixed is applied, wavelength shift caused by an input current or problems such as a distribution and low efficiency caused by a low current may be prevented and emission efficiency may be increased. However, example embodiments are not limited thereto, and in other example embodiments, the pixel driving integrated circuit 300 may further include a current adjuster and may be configured so that at least one of the first level I1, the second level I2, and the third level I3 has a different value.

Figure 6A:
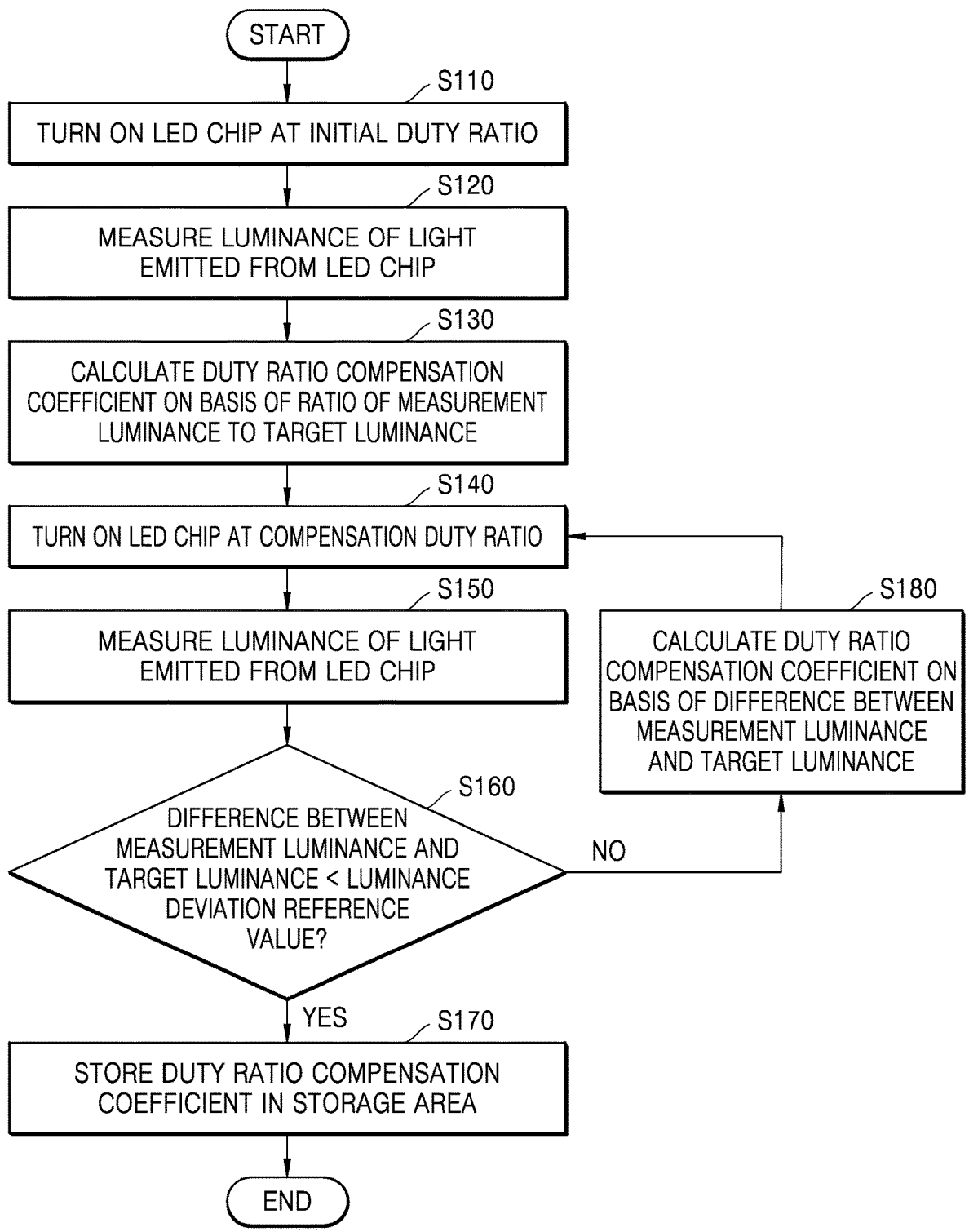
Figure 6B:
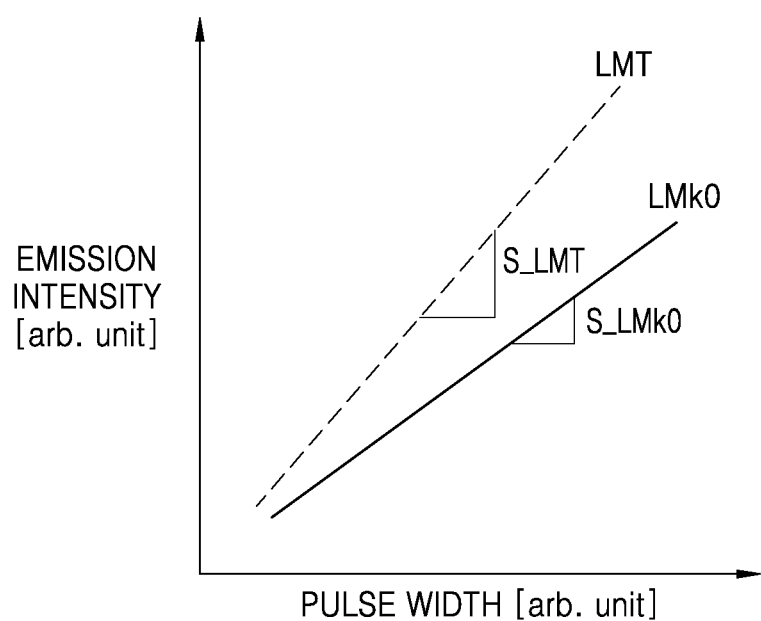
Figure 6C:
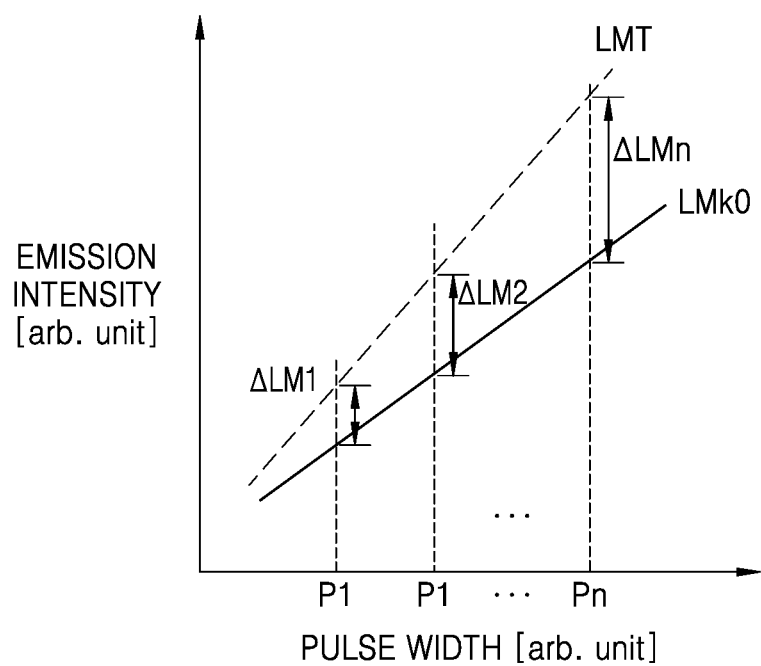
Figure 6D:
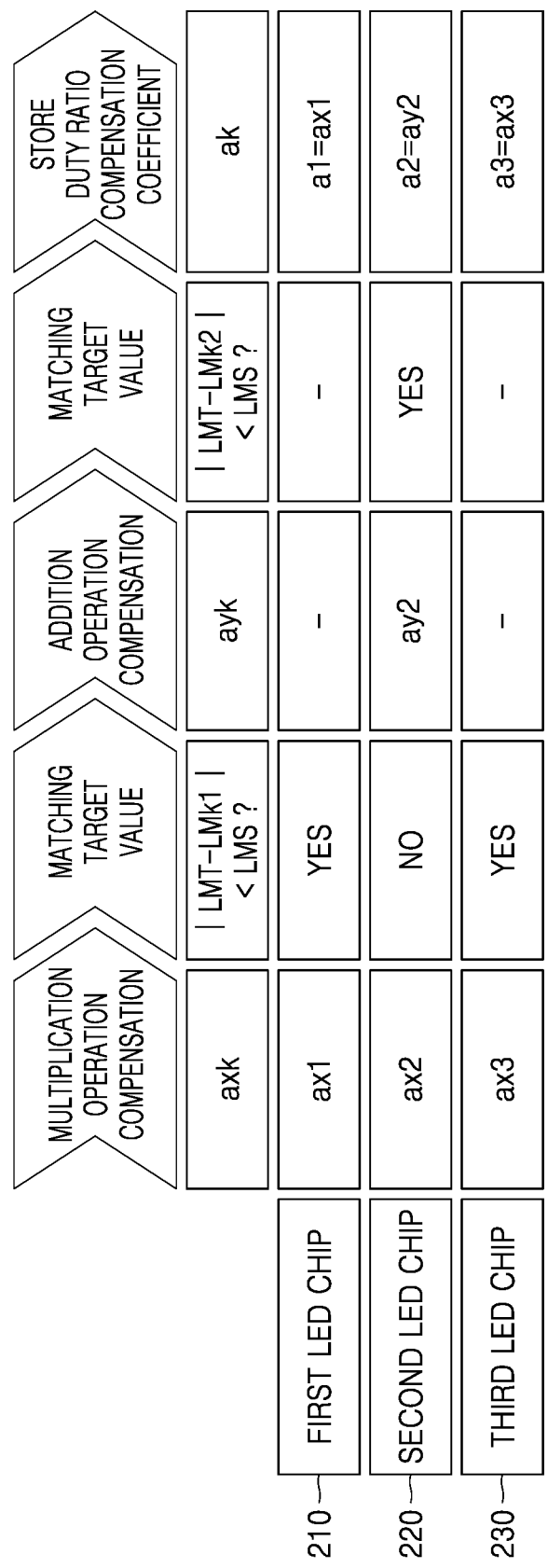

FIG. 6A is a flowchart illustrating a method of determining duty ratio compensation data, according to example embodiments. FIG. 6B is a schematic graph for describing a multiplication operation method of FIG. 6A. FIG. 6C is a schematic graph for describing an addition operation method of FIG. 6A. FIG. 6D is a schematic diagram showing duty ratio compensation data obtained in each operation of FIG. 6A. In detail, FIGS. 6A to 6D schematically illustrate an exemplary method of determining duty ratio compensation data for generating the pieces of duty ratio compensation data DCC1, DCC2, and DCC3 of the LED chips 210 to 230 stored in the second storage area 340 of the pixel driving integrated circuit 300.

Referring to FIGS. 6A to 6D, the LED chips 200 may be turned on at an initial duty ratio in operation S110.

Luminance of light emitted from the LED chips 200 may be measured in operation S120. Measurement luminance $LMk0$ of each of the LED chips 200 may be obtained. For example, measurement luminances LM10, LM20, and LM30 of the first to third LED chips 210 to 230 may be obtained.

In example embodiments, as illustrated in FIG. 6B, the measurement luminance $LMk0$ of each of the LED chips 200 may be obtained by sweeping a pulse width of a driving current (or an application time of the driving current) applied to the LED chips 200. For example, by gradually increasing the pulse width (or the application time) of the driving current applied to the LED chips 200, emission intensity of each pulse width may be measured.

A duty ratio multiplication compensation coefficient $axk$ may be calculated based on a ratio of target luminance LMT to the measurement luminance $LMk0$ of each of the LED chips 200 in operation S130. For example, first to third duty ratio compensation coefficients ax1, ax2, and ax3 may be calculated based on a ratio of the target luminance LMT to each of the measurement luminances LM10, LM20, and LM30 of the first to third LED chips 210 to 230.

In example embodiments, in a case where luminance is measured by sweeping a pulse width of a driving current applied to the LED chips 200, the duty ratio multiplication compensation coefficient $axk$ may be calculated based on the following Equation 1:

$$axk = S\_LMT/S\_LMk0 \quad \text{(Equation 1)}$$

In Equation 1, $axk$ may denote a duty ratio multiplication compensation coefficient of a $k^{th}$ LED chip, $S\_LMk0$ may denote a slope of measurement luminance with respect to a pulse width of the $k^{th}$ LED chip, and $S\_LMT$ may denote a slope of target luminance with respect to the pulse width)

For example, when the slope $S\_LMk0$ of the measurement luminance $LMk0$ of each of the LED chips 200 is less than the slope $S\_LMT$ of the target luminance LMT, the duty ratio multiplication compensation coefficient $axk$ may have a value which is greater than 1. When the slope $S\_LMk0$ of the measurement luminance $LMk0$ of each of the LED chips 200 is greater than the slope $S\_LMT$ of the target luminance LMT, the duty ratio multiplication compensation coefficient $axk$ may have a value which is less than 1.

According to an example embodiment shown in the timing diagram of FIG. 5, a slope S_LMk0 of the measurement luminance LM10 of the first LED chip 210 may be less than the slope S_LMT of the target luminance LMT, and a first duty ratio multiplication compensation coefficient ax1 may have a value which is greater than 1. A slope S_LMk0 of the measurement luminance LM20 of the second LED chip 220 may be less than the slope S_LMT of the target luminance LMT, and a second duty ratio multiplication compensation coefficient ax2 may have a value which is greater than 1. Also, a slope S_LMk0 of the measurement luminance LM30 of the third LED chip 230 may be greater than the slope S_LMT of the target luminance LMT, and a third duty ratio multiplication compensation coefficient ax3 may have a value which is less than 1.

The LED chips 200 may be turned on at a compensation duty ratio in operation S140. The compensation duty ratio may have a value obtained by performing a multiplication operation on an initial duty ratio and the duty ratio multiplication compensation coefficient axk. For example, when the duty ratio multiplication compensation coefficient axk is greater than 1, the compensation duty ratio may be greater than the initial duty ratio, and when the duty ratio multiplication compensation coefficient axk is less than 1, the compensation duty ratio may be less than the initial duty ratio.

Luminance of light emitted from each of the LED chips 200 may be measured, and first measurement luminance LMk1 of each of the LED chips 200 may be obtained in operation S150. For example, first measurement luminances LM11, LM21, and LM31 of the first to third LED chips 210 to 230 may be obtained.

In operation S160, a luminance difference between the first measurement luminance LMk1 of each of the LED chips 200 and the target luminance LMT may be compared with a luminance deviation reference value LMS. In example embodiments, the luminance deviation reference value LMS may include about 10% or less, about 5% or less, about 3% or less, about 2% or less, or about 1% or less of the target luminance LMT, but is not limited thereto and the luminance deviation reference value LMS may vary based on a characteristic needed for an application including the LED package 1000.

For example, when the luminance difference between the first measurement luminance LMk1 of each of the LED chips 200 and the target luminance LMT is equal to or less than the luminance deviation reference value LMS, the duty ratio multiplication compensation coefficient axk may be stored in the second storage area 340 in operation S170.

For example, when the luminance difference between the first measurement luminance LMk1 of each of the LED chips 200 and the target luminance LMT is greater than the luminance deviation reference value LMS, an additional operation may be performed on a duty ratio addition compensation coefficient ayk from a luminance difference between the measurement luminance LMk0 of each of the LED chips 200 and the target luminance LMT in operation S180.

The duty ratio addition compensation coefficient ayk may correspond to a difference value between the target luminance LMT and the measurement luminance LMk0. The duty ratio addition compensation coefficient ayk may be a compensation coefficient for an addition operation performed on a duty ratio.

In example embodiments, in a case where luminance is measured by sweeping a pulse width of a driving current applied to the LED chips 200, the duty ratio addition compensation coefficient ayk may be determined as an arithmetic average of luminance difference values between the target luminance LMT and the measurement luminance LMk0 of the LED chips 200 obtained at a plurality of sampling points P1, P2, . . . , and Pn (for example, obtained in a plurality of pulse widths), and the duty ratio addition compensation coefficient ayk may be calculated based on the following Equation 2:

$$ayk = (\Delta LM1 + \Delta LM2 + \ldots + \Delta LMn)/n \quad \text{(Equation 2)}$$

In Equation 2, ayk may denote a duty ratio addition compensation coefficient of the $k^{th}$ LED chip, n may denote the number of sampling points (for example, n may be 3 to 10), $\Delta LM1$ may denote a difference between target luminance and measurement luminance at a first sampling point P1, $\Delta LM2$ may denote a difference between target luminance and measurement luminance at a second sampling point P2, and $\Delta LMn$ may denote a difference between target luminance and measurement luminance at an $n^{th}$ sampling point Pn).

Subsequently, the LED chips 200 may be turned on at an additionally-calculated compensation duty ratio in operation S140. The additionally-calculated compensation duty ratio may have a value obtained through an addition operation performed on the initial duty ratio and the duty ratio addition compensation coefficient ayk.

Luminance of light emitted from each of the LED chips 200 may be measured in operation S150. Second measurement luminance LMk2 of each of the LED chips 200 may be obtained.

In operation S160, a luminance difference between the second measurement luminance LMk2 of each of the LED chips 200 and the target luminance LMT may be compared with the luminance deviation reference value LMS. For example, when the luminance difference between the second measurement luminance LMk1 of each of the LED chips 200 and the target luminance LMT is equal to or less than the luminance deviation reference value LMS, the duty ratio addition compensation coefficient ayk may be stored in the second storage area 340 in operation S170.

According to an example embodiment shown in the timing diagram of FIG. 5, the first and third LED chips 210 and 230 may store first and third duty ratio multiplication compensation coefficients ax1 and ax3, obtained from a ratio of the target luminance LMT to the measurement luminances LM10 and LM30, in the second storage area 340, and the second LED chip 220 may store second duty ratio addition compensation coefficient ay2, obtained from a difference between the measurement luminance LM20 and the target luminance LMT through an additional operation, in the second storage area 340. That is, the first duty ratio compensation coefficient a1 may correspond to a value of the first duty ratio multiplication compensation coefficient ax1, the second duty ratio compensation coefficient a2 may correspond to a value of the second duty ratio addition compensation coefficient ay2, and the third duty ratio compensation coefficient a3 may correspond to a value of the third duty ratio multiplication compensation coefficient ax3.

In this case, the pieces of duty ratio compensation data DCC1 and DCC3 of the first and third LED chips 210 and 230 may each include data of 1 bit (for example, a mode selection bit MDS of "0") for performing a duty ratio compensation operation on the basis of the first mode corresponding to a multiplication operation. The duty ratio compensation data DCC2 of the second LED chip 220 may include data of 1 bit (for example, a mode selection bit MDS of "1") for performing a duty ratio compensation operation on the basis of the second mode corresponding to an addition operation.

For example, the duty ratio compensation data DCC1 of the first LED chip 210 may include k bits, which may include a mode selection bit MDS (for example, data "0") for selecting the first mode and data of k−1 bits including the first duty ratio compensation coefficient a1 based on a luminance characteristic value of the first LED chip 210. The duty ratio compensation data DCC2 of the second LED chip 220 may include k bits, which may include a mode selection bit MDS (for example, data "1") for selecting the second mode and data of k−1 bits including the second duty ratio compensation coefficient a2 based on a luminance characteristic value of the second LED chip 220. The duty ratio compensation data DCC3 of the third LED chip 230 may include k bits, which may include a mode selection bit MDS (for example, data "0") for selecting the first mode and data of k−1 bits including the third duty ratio compensation coefficient a3 based on a luminance characteristic value of the third LED chip 230.

In FIGS. 4 to 6D, an example embodiment has been described where a duty ratio compensation operation of the first mode corresponding to a multiplication operation is performed on the first and third LED chips 210 and 230, and a duty ratio compensation operation of the second mode corresponding to an addition operation is performed on the second LED chip 220. However, example embodiments are not limited thereto, and in other example embodiments, various combinations where a duty ratio compensation operation of one of the first mode and the second mode is performed may be implemented.

When the duty ratio compensation coefficients a1, a2, and a3 of all pixels are calculated, a compensation method may end.

A method of determining the pieces of duty ratio compensation data DCC1, DCC2, and DCC3 according to example embodiments may be performed in a process of manufacturing the LED package 1000. In this case, the pieces of duty ratio compensation data DCC1, DCC2, and DCC3 of the first to third LED chips 210 to 230 may be determined in a process of manufacturing the LED package 1000 and may be stored in the second storage area 340, and a plurality of duty ratio-compensated driving currents DI1, DI2, and DI3 where a duty ratio has been compensated for based on the pieces of duty ratio compensation data DCC1, DCC2, and DCC3 stored in the second storage area 340 may be applied to the first to third LED chips 210 to 230 in a process of performing operations of the first to third LED chips 210 to 230. In other example embodiments, a method of determining the pieces of duty ratio compensation data DCC1, DCC2, and DCC3 may be periodically performed in a process of performing an operation of the LED package 1000, and the newly determined duty ratio compensation coefficients a1, a2, and a3 may be stored in the second storage area 340 again.

Generally, in a passive matrix (PM) mode, N (where N is an integer of 2 or more) LED packages may be serially connected to one another and may be driven by one integrated circuit. One frame period is divided into N division periods and one LED package is driven during one division period. In this case, in a low grayscale period, when flickering occurs before a sufficient voltage is applied to an LED chip, a flickering phenomenon may occur. Also, an afterimage or a ghost phenomenon occurs where a previous pixel blurredly re-emits light due to a parasitic capacitance which occurs in an LED package due to flickering between pixels.

On the other hand, in an AM mode according to example embodiments, each LED package may include a pixel driving integrated circuit, and thus, even when N number of LED packages are serially connected to one another, each of the LED packages may be driven by using an entirety of one frame period. Therefore, in contrast to the passive matrix mode, a turn-on time of one LED package may increase, and thus, the above-described flickering phenomenon may not occur. Also, an emission operation of a current frame may be performed based on frame data of a previous frame, and a reset period FRS may be between adjacent frame periods, whereby the above-described ghost phenomenon may not occur.

Also, in the LED package 1000 according to example embodiments, the pixel driving integrated circuit 300 may perform a duty ratio compensation operation through a multiplication operation or an addition operation on the basis of the luminance characteristic value of each of the first to third LED chips 210 to 230. Therefore, even when the first to third LED chips 210 to 230 have different luminance characteristic values, light having uniform luminance may be emitted from the LED package 1000. In other words, in terms of binning of the LED chips 200, even when the LED package 1000 is manufactured by using the LED chips 200 having a relatively large luminance deviation, the LED package 1000 may emit light having uniform luminance, thereby decreasing the manufacturing cost of the LED package 1000. Moreover, the LED package 1000 may enable a display apparatus to display an image where a luminance deviation is compensated for in a grayscale, and thus may increase image quality and may prevent flickering in a low grayscale, thereby increasing the reliability of an operation of a display apparatus including the LED package 1000.

Figure 7:
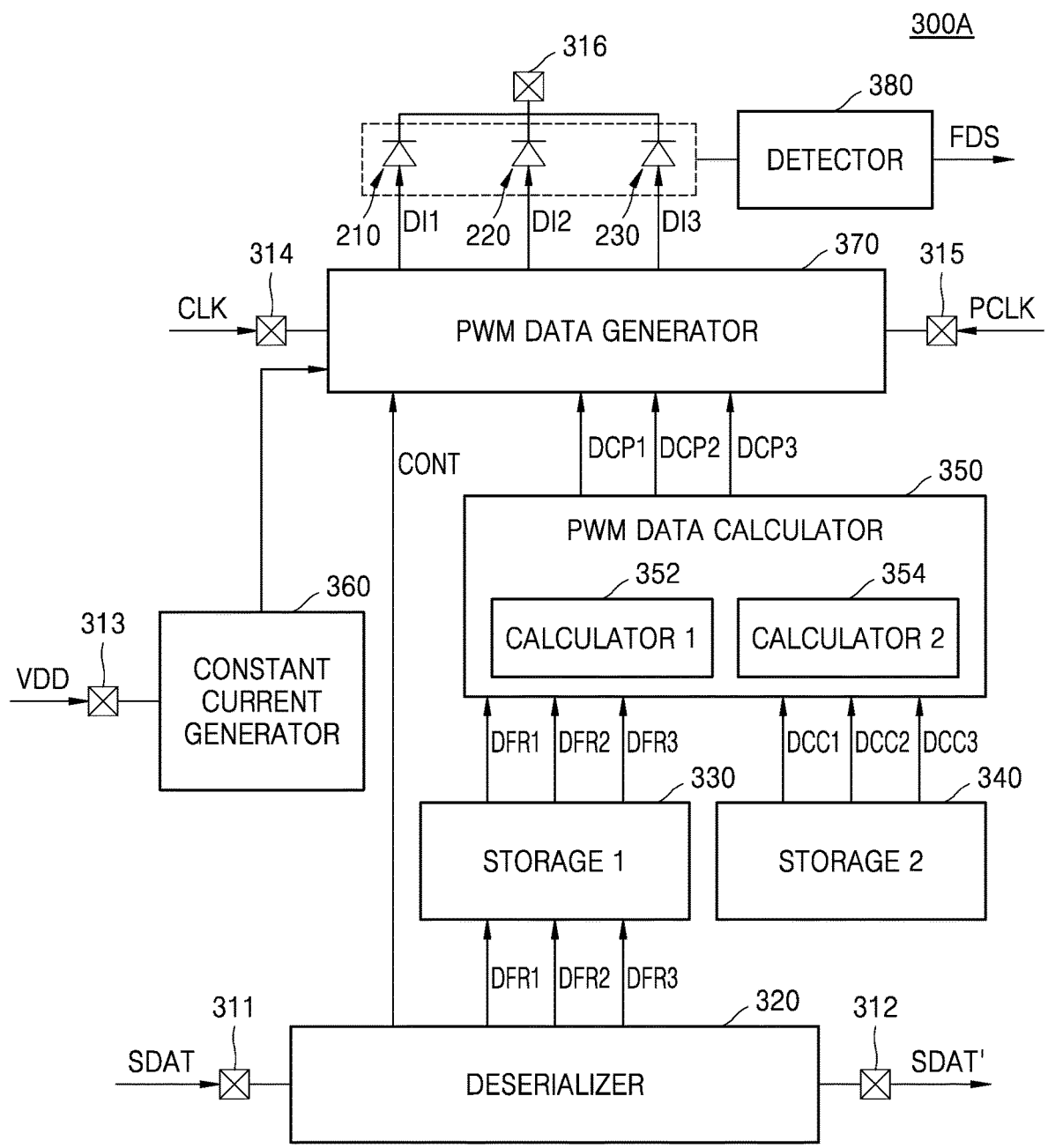
FIG. 7 is a circuit diagram for describing a pixel driving integrated circuit according to example embodiments.

FIG. 7 is a circuit diagram for describing a pixel driving integrated circuit 300A according to example embodiments. In FIG. 7, the same reference numerals as FIGS. 1 to 6D refer to the same elements.

Referring to FIG. 7, the pixel driving integrated circuit 300A may further include a detector 380. When an electrical defect occurs in at least one of first to third LED chips 210 to 230, the detector 380 may detect the electrical defect to generate a failure detection signal FDS. For example, the electrical defect may include an undesired short circuit or open between the first to third LED chips 210 to 230 and the pixel driving integrated circuit 300A.

In some example embodiments, the failure detection signal FDS may be fed back to an external controller (1400 of FIG. 16). In this case, the external controller may limit driving of the first to third LED chips 210 to 230 on the basis of the failure detection signal FDS. The pixel driving integrated circuit 300A may further include a feedback pad for providing the failure detection signal FDS to the external controller.

In some other example embodiments, the failure detection signal FDS may be fed back to the first storage area 330, and the first storage area 330 may limit (for example, masking) driving of the first to third LED chips 210 to 230 on the basis of the failure detection signal FDS.

In some other example embodiments, the failure detection signal FDS may be fed back to a PWM data generator 370, and the PWM data generator 370 may limit (for example, masking) driving of the first to third LED chips 210 to 230 on the basis of the failure detection signal FDS.

Figure 8:
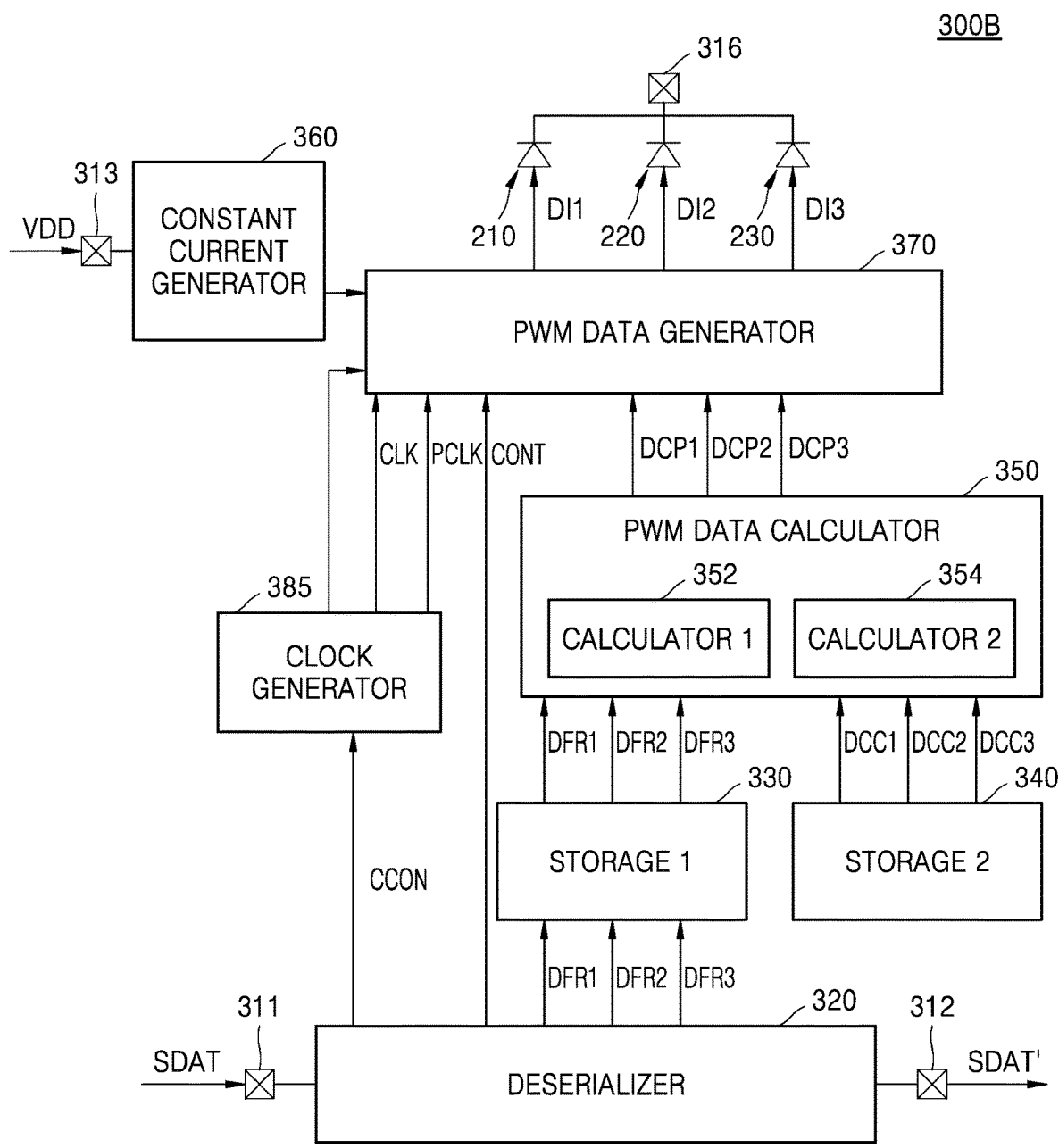
FIG. 8 is a circuit diagram for describing a pixel driving integrated circuit according to example embodiments.

FIG. 8 is a circuit diagram for describing a pixel driving integrated circuit 300B according to example embodiments.

Referring to FIG. 8, the pixel driving integrated circuit 300B may further include a clock generator 385, and the first clock pad 314 (see FIG. 2) and the second clock pad 315 (see FIG. 2) may be omitted.

Frame data distributed by a deserializer 320 may further include clock data CCON. The clock generator 385 may generate a clock signal CLK and a PWM clock signal PCLK on the basis of the clock data CCON.

Figure 9:
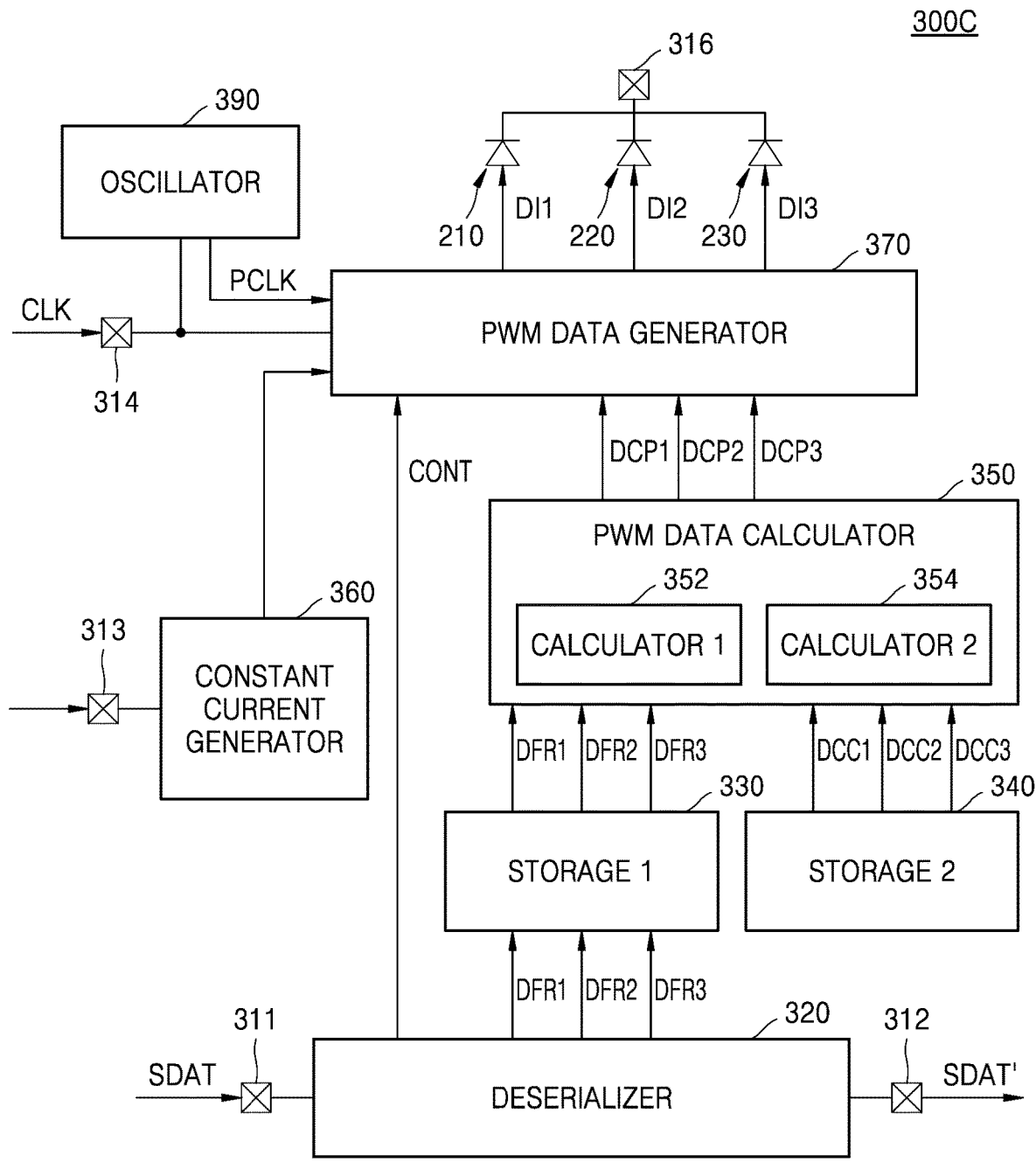
FIG. 9 is a circuit diagram for describing a pixel driving integrated circuit according to example embodiments.

FIG. 9 is a circuit diagram for describing a pixel driving integrated circuit 300C according to example embodiments.

Referring to FIG. 9, the pixel driving integrated circuit 300C may further include an oscillator 390, and the second clock pad 315 (see FIG. 2) may be omitted.

The oscillator 390 may generate a PWM clock signal PCLK on the basis of a clock signal CLK received through a first clock pad 314. For example, the oscillator 390 may include a ring oscillator, an RC oscillator, a crystal oscillator, or a temperature compensation crystal oscillator, but is not limited thereto.

Figure 10:
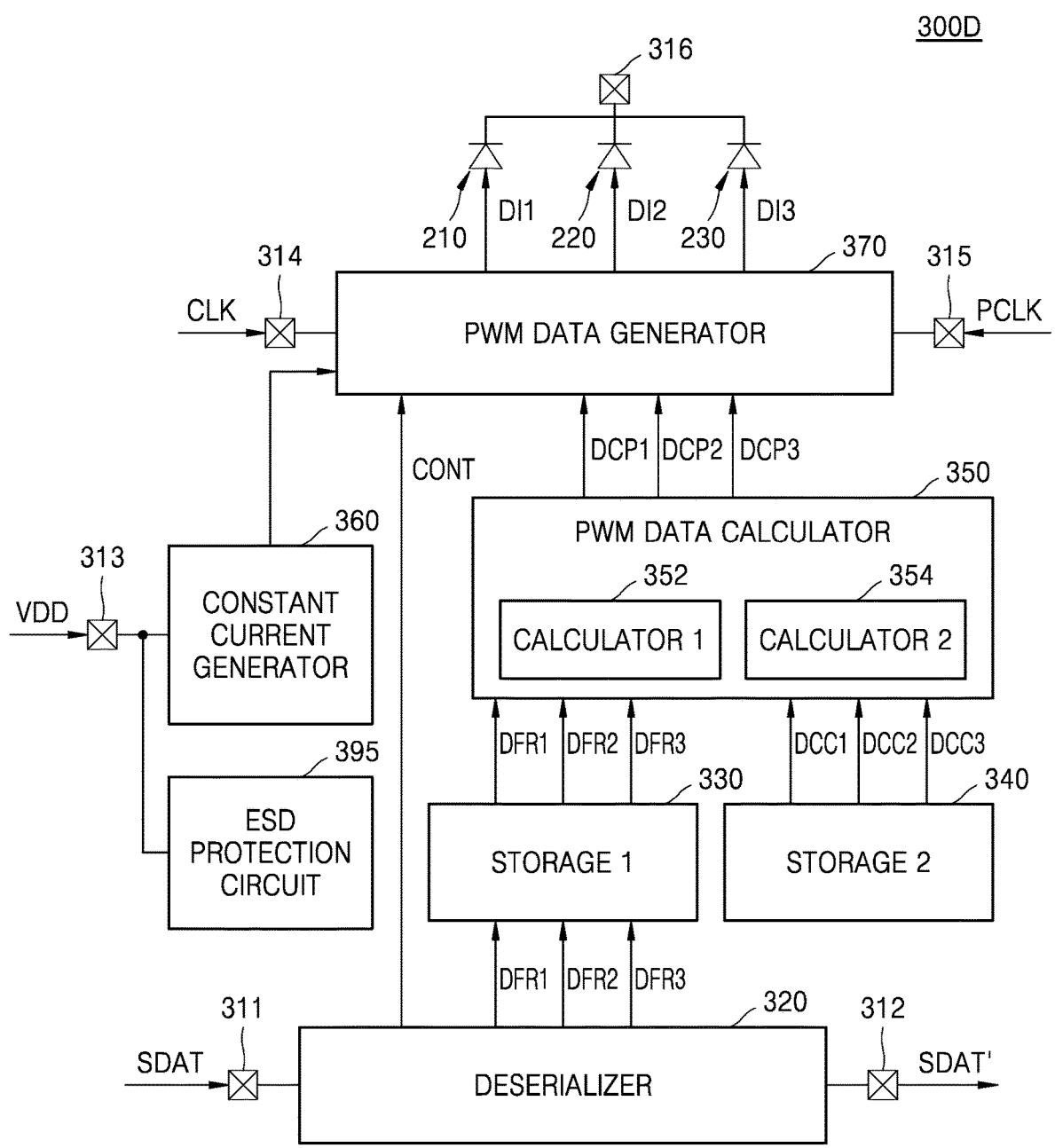
FIG. 10 is a circuit diagram for describing a pixel driving integrated circuit according to example embodiments.

FIG. 10 is a circuit diagram for describing a pixel driving integrated circuit 300D according to example embodiments.

Referring to FIG. 10, the pixel driving integrated circuit 300D may include an electrostatic discharge (ESD) protection circuit 395. The ESD protection circuit 395 may be connected to a power pad 313. The ESD protection circuit 395 may protect elements of the pixel driving integrated circuit 300D from a large amount of electric charges which flow in from the outside when an ESD event occurs. In other example embodiments, the ESD protection circuit 395 may be further connected to a ground pad 316.

The pixel driving integrated circuit 300D may further include an ESD protection circuit connected to at least one of a data input pad 311, a data output pad 312, and first and second clock pads 314 and 315.

Figure 11:
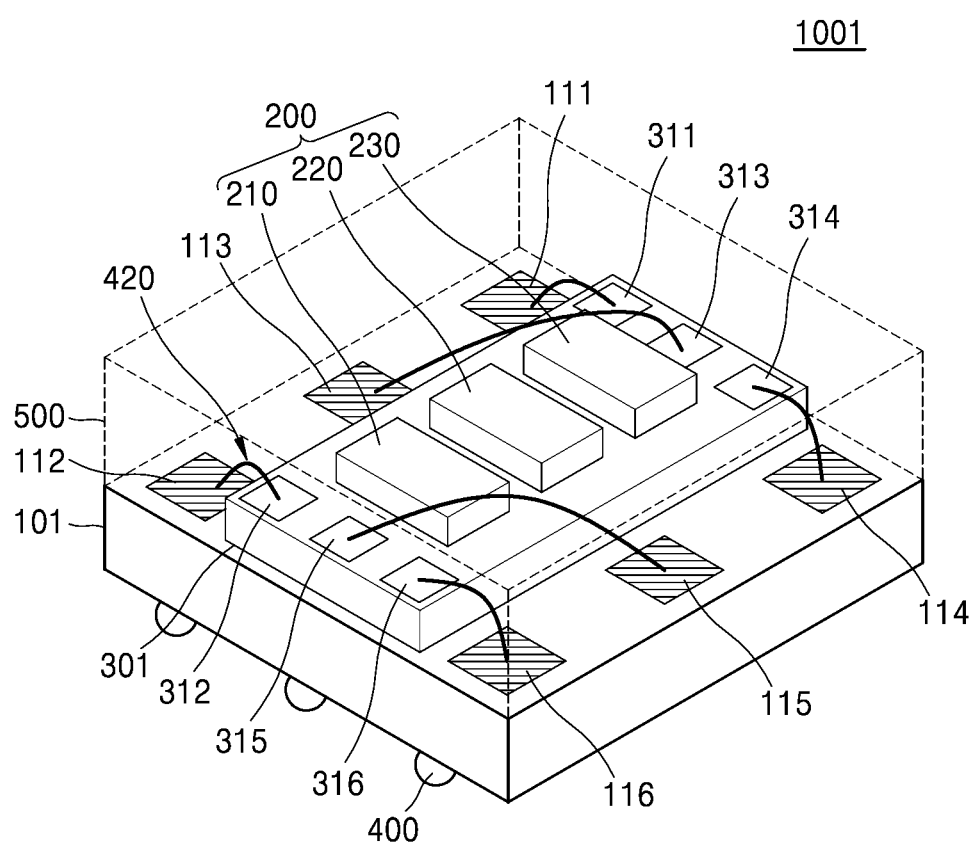
FIG. 11 is a perspective view illustrating an LED package according to example embodiments.

FIG. 11 is a perspective view illustrating an LED package 1001 according to example embodiments.

Referring to FIG. 11, the LED package 1001 may include a package substrate 101, first to third LED chips 210 to 230, a pixel driving integrated circuit 301, an external connection terminal 400, a plurality of bonding wires 420, and a sealing member 500.

The package substrate 101 and the pixel driving integrated circuit 301 may be connected to each other by a wire bonding manner by using the plurality of bonding wires 420. The package substrate 101 may include a plurality of pads 111 to 116, which are electrically connected to a plurality of pads 311 to 316 of the pixel driving integrated circuit 301 and are horizontally apart from the pixel driving integrated circuit 301. The plurality of pads 111 to 116 may include a data input pad 111, a data output pad 112, a power pad 113, a plurality of clock pads 114 and 115, and a ground pad 116.

The pixel driving integrated circuit 301 may include the plurality of pads 311 to 316 which are electrically connected to the package substrate 101 and are provided on a top surface (i.e., a surface opposite to a surface facing the package substrate 101) of the pixel driving integrated circuit 301. For example, the plurality of pads 311 to 316 may include a data input pad 311, a data output pad 312, a power pad 313, a plurality of clock pads 314 and 315, and a ground pad 316. The plurality of pads 111 to 116 of the package substrate 101 may be connected to the plurality of pads 311 to 316 of the pixel driving integrated circuit 301 by the plurality of bonding wires 420.

Figure 12:
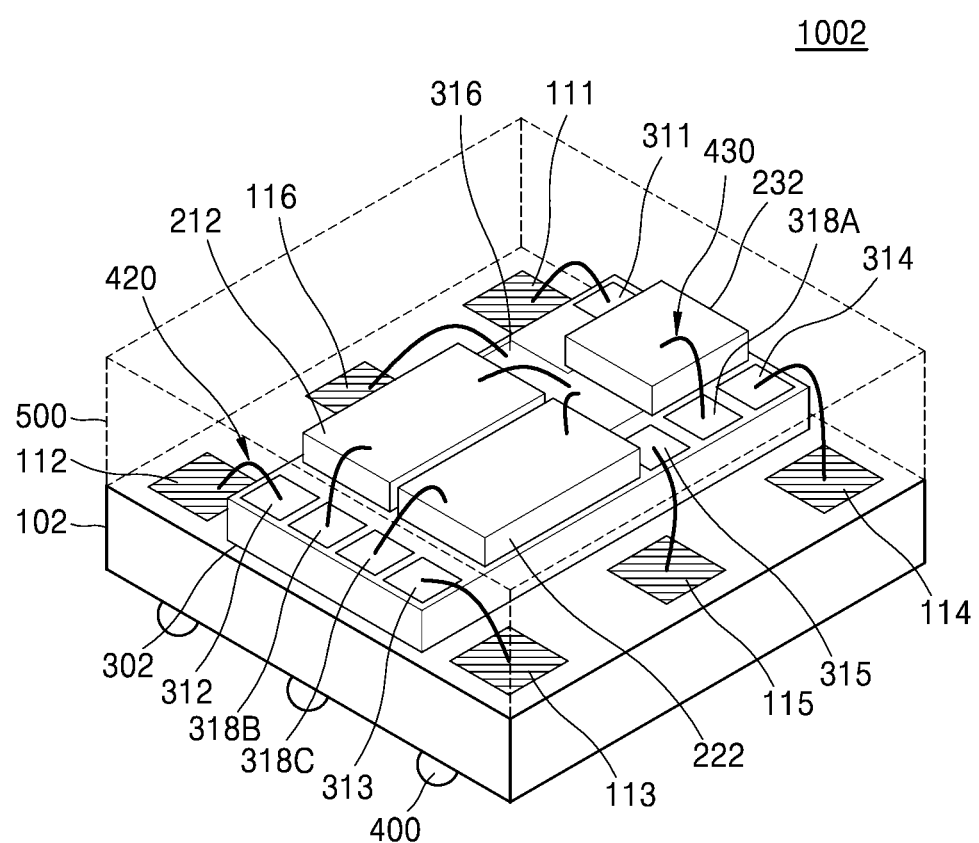
FIG. 12 is a perspective view illustrating an LED package according to example embodiments.

FIG. 12 is a perspective view illustrating an LED package 1002 according to example embodiments.

Referring to FIG. 12, the LED package 1002 may include a package substrate 102, first to third LED chips 212, 222, and 232, a pixel driving integrated circuit 302, an external connection terminal 400, a plurality of bonding wires 420 and 430, and a sealing member 500.

The package substrate 102 and the pixel driving integrated circuit 302 may be connected to each other by a wire bonding manner by using the plurality of bonding wires 420 and 430. The first to third LED chips 212, 222, and 232 may include an epi-up chip (i.e., a non-flip chip), and thus, may be connected to the pixel driving integrated circuit 302 by a bonding wire manner.

The package substrate 102 may be substantially the same as the package substrate 101 of FIG. 11, and thus, a repetitive description thereof is omitted.

The pixel driving integrated circuit 302 may further include first to third pads 318A, 318B, and 318C for electrical connections with the first to third LED chips 212, 222, and 232. The bonding wires 420 may be for electrically connecting the package substrate 102 to the pixel driving integrated circuit 302. The bonding wires 430 may be for electrically connecting the first to third LED chips 212, 222, and 232 to the pixel driving integrated circuit 302. In detail, the bonding wires 430 may respectively connect the first to third LED chips 212, 222, and 232 to the first to third pads 318A, 318B, and 318C.

Figure 13:
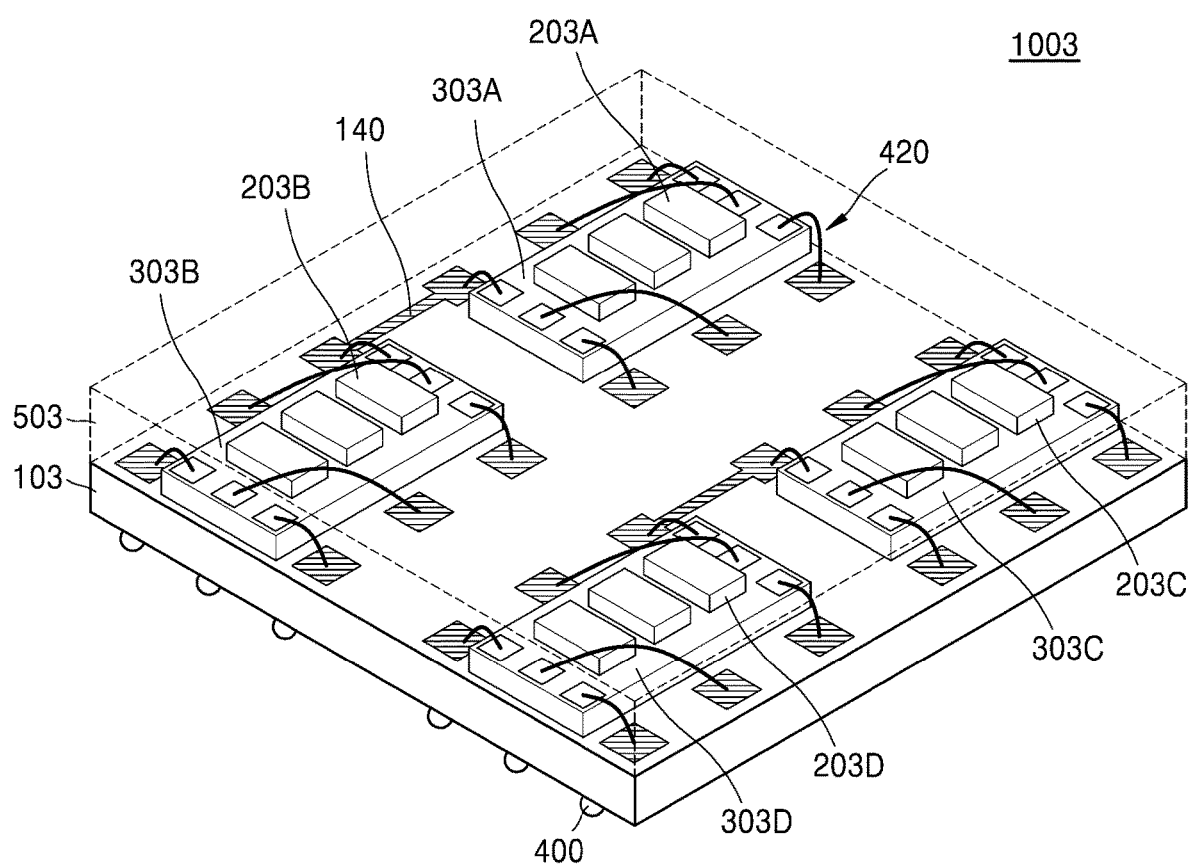
FIG. 13 is a perspective view illustrating an LED package according to example embodiments.

FIG. 13 is a perspective view illustrating an LED package 1003 according to example embodiments.

Referring to FIG. 13, the LED package 1003 may include a plurality of LED chips 203A, 203B, 203C, and 203D and a plurality of pixel driving integrated circuits 303A, 303B, 303C, and 303D and may further include a package substrate 103, a sealing member 503, and a plurality of bonding wires 420.

Unlike the LED package 1000 having a single structure of FIG. 1 where one LED pixel and one pixel driving integrated circuit 300 are provided on one package substrate 100, in the LED package 1003 of FIG. 13, a plurality of LED pixels and the plurality of pixel driving integrated circuits 303A, 303B, 303C, and 303D may be provided on one package substrate 103. Particularly, in the example embodiment of FIG. 13, a 4-in-1 structure where four LED pixels are provided on one package substrate 103 is illustrated. However, example embodiments are not limited thereto, and an M-in-1 structure where M (where M is a natural number of 2 or more) number of LED pixels are provided on one package substrate may be widely applied.

As illustrated in FIG. 13, by using a connection wiring 140 included in the package substrate 103, a data output terminal of the pixel driving integrated circuit 303A may be connected to a data input terminal of the pixel driving integrated circuit 303B, and a data output terminal of the pixel driving integrated circuit 303C may be connected to a data input terminal of the pixel driving integrated circuit 303D. As described above, because the 4-in-1 structure is applied, the number of lower pins of the package substrate 103 may decrease, and thus, high-resolution data may be processed at a high speed.

Figure 14:
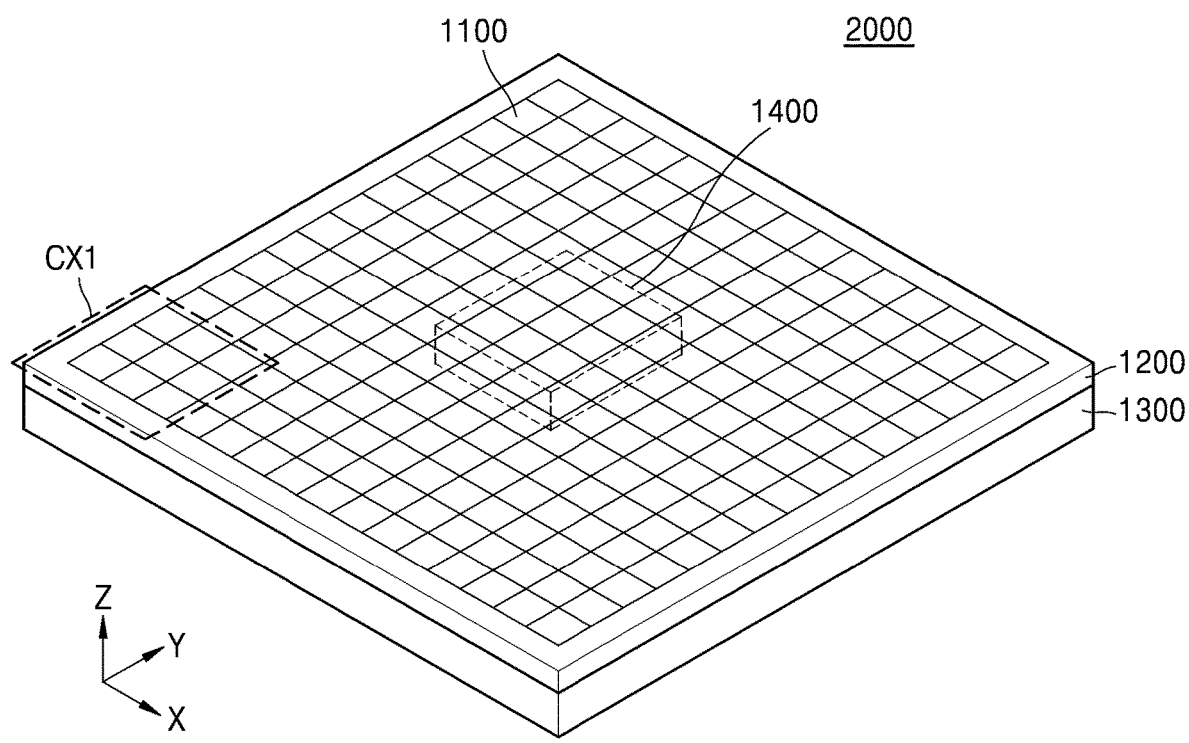
FIG. 14 is a perspective view for describing a display apparatus according to example embodiments.
Figure 15:
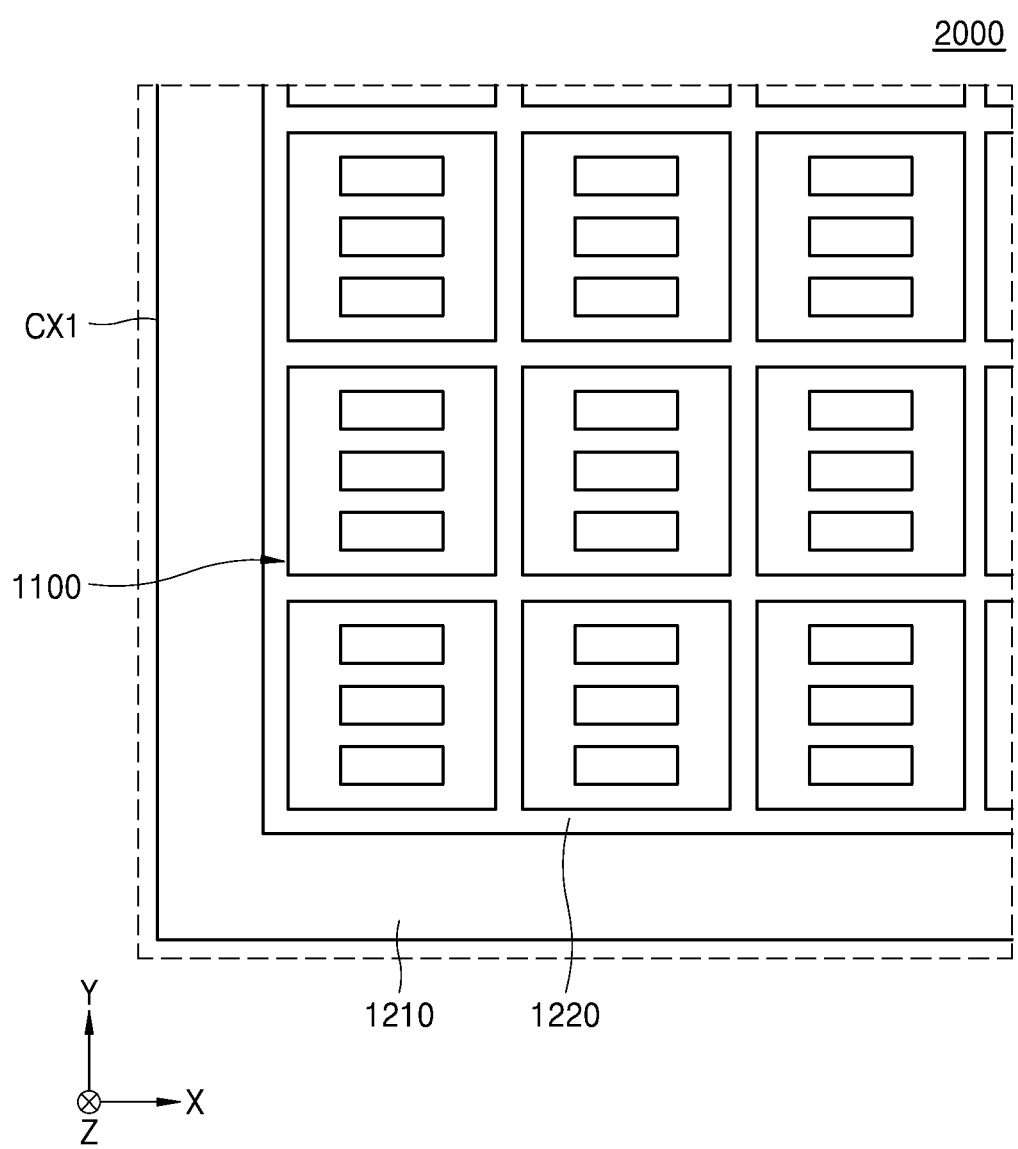
FIG. 15 is a plan view illustrating the enlargement of a region CX1 of FIG. 14.

FIG. 14 is a perspective view for describing a display apparatus 2000 according to example embodiments. FIG. 15 is a plan view illustrating the enlargement of a region CX1 of FIG. 14. FIG. 16 is a cross-sectional view of the display apparatus 2000 of FIG. 14.

Referring to FIGS. 14 to 16, the display apparatus 2000 may include an LED module 1200 including a plurality of LED packages 1100, a PCB 1300, and a controller 1400.

The PCB 1300 may be referred to as a module board and may include a complicated internal wiring for connecting the plurality of LED packages 1100 to the controller 1400.

The plurality of LED packages 1100 may be disposed on a first surface of the PCB 1300 and may include one of the LED packages 1000, 1001, 1002, and 1003 illustrated in FIGS. 1 to 13. Each of the plurality of LED packages 1100 may configure one pixel of the display apparatus 2000, and the plurality of LED packages 1100 may be arranged to configure rows and columns in an X direction and a Y direction on the PCB 1300. In FIG. 14, a case where the display apparatus 2000 includes the plurality of LED packages 1100 arranged in a 15*15 matrix form is illustrated, but example embodiments are not limited thereto. The display apparatus 2000 may include a plurality of LED packages which are variously arranged, for example, 1024*768, 1920*1080, etc., based on a resolution which is to be realized.

The controller 1400 may be disposed on a second surface opposite to the first surface of the PCB 1300 and may control driving of the plurality of LED packages 1100. For example, the controller 1400 may provide a signal and power for driving a pixel driving integrated circuit included in each of the plurality of LED packages 1100. In FIG. 14, only one controller 1400 is illustrated, but example embodiments are not limited thereto, and a plurality of controllers may be disposed on the second surface of the PCB 1300. The number of controllers may be determined based on the total number of LED packages 1100 and the number of LED packages driven by one controller 1400.

As illustrated in FIG. 15, the display apparatus 2000 may further include a first partition wall structure 1210 which defines a region, where the plurality of LED packages 1100 are disposed, of the PCB 1300. Also, each of the plurality of LED packages 1100 may be disposed to be surrounded by a second partition wall structure 1220. Each of the plurality of LED packages 1100 may be electrically isolated by the second partition wall structure 1220 and may be independently driven as a separate pixel. In some example embodiments, the first and second partition wall structures 1210 and 1220 may each include a black matrix, but are not limited thereto.

As illustrated in FIG. 16, LED packages 1100 disposed in the same row or column may be serially connected to one another through wirings 1310 of the PCB 1300. Therefore, each of the LED packages 1100 may obtain only frame data thereof from among pieces of serial data transferred from the controller 1400 and may transfer the other data to a next LED package.

While aspects of example embodiments have been particularly shown and described, it will be understood that various changes in form and details may be made therein without departing from the spirit and scope of the following claims.

What is claimed is:
1. A light-emitting diode (LED) package comprising:
a first LED pixel including a plurality of first LED chips; and
a first pixel driving integrated circuit configured to drive the plurality of first LED chips according to an active matrix (AM) mode using entirety of a first frame period,
wherein the first pixel driving integrated circuit comprises:
a first storage area configured to store first frame data of each of the plurality of first LED chips;
a second storage area configured to store duty ratio compensation data of each of the plurality of first LED chips;
a pulse width modulation (PWM) data calculator configured to perform an arithmetic operation on the first frame data provided from the first storage area and the duty ratio compensation data provided from the second storage area to generate PWM data;
a PWM data generator configured to adjust an emission duty ratio based on the PWM data; and
a deserializer configured to receive serial data from an external controller, extract and store the first frame data of each of the plurality of first LED chips from the serial data, and provide the first frame data to the first storage area,
wherein each of the PWM data calculator and the PWM data generator is connected between the plurality of first LED chips and the deserializer,
wherein the PWM data calculator is configured to perform a first arithmetic operation on the first frame data and the duty ratio compensation data in a first mode and a second arithmetic operation on the first frame data and the duty ratio compensation data in a second mode, and
wherein the first arithmetic operation and the second arithmetic operation are different.

2. The LED package of claim 1, wherein the first pixel driving integrated circuit comprises:
a constant current generator configured to generate a reference current based on a source voltage,
wherein the PWM data generator is configured to provide a plurality of first driving currents to the plurality of first LED chips based on a clock signal, a PWM clock signal, the PWM data, and the reference current provided from the constant current generator, and
wherein the PWM data calculator is configured to perform a multiplication operation on the first frame data and the duty ratio compensation data in the first mode and an addition operation on the first frame data and the duty ratio compensation data in a in the second mode.

3. The LED package of claim 2, wherein the duty ratio compensation data comprises data of k bits (where k is a natural number of 4 or more),
wherein a first bit of the duty ratio compensation data indicates one mode from among the first mode and the second mode, and
wherein k−1 bits of the duty ratio compensation data indicate a duty ratio compensation coefficient based on a luminance characteristic value of a corresponding LED chip of the plurality of first LED chips.

4. The LED package of claim 2, wherein the first pixel driving integrated circuit is configured to:
during the first frame period, receive and provide the first frame data to the first storage area, and
during a second frame period after the first frame period, using one of the first mode and the second mode, generate the plurality of first driving currents based on the PWM data calculated by performing the arithmetic operation on the first frame data provided from the first storage area and the duty ratio compensation data provided from the second storage area and to receive and provide second frame data to the first storage area.

5. The LED package of claim 2, wherein the first pixel driving integrated circuit further comprises a detector configured to, based on an electrical defect occurring in at least one of the plurality of first LED chips, detect the electrical defect and generate a failure detection signal.

6. The LED package of claim 5, wherein the failure detection signal is provided to the external controller, and
wherein driving of the plurality of first LED chips is limited based on the failure detection signal.

7. The LED package of claim 5, wherein the failure detection signal is provided to any one or any combination of the first storage area and the PWM data generator, and
wherein driving of the plurality of first LED chips is limited based on the failure detection signal.

8. The LED package of claim 2, wherein the first pixel driving integrated circuit comprises:
a data input pad configured to receive the serial data;
a data output pad configured to output data, other than the first frame data, of the serial data;
a power pad configured to receive the source voltage;
a first clock pad configured to receive the clock signal;
a second clock pad configured to receive the PWM clock signal; and
a ground pad connected to the plurality of first LED chips.

9. The LED package of claim 2, wherein the first pixel driving integrated circuit further comprises an oscillator configured to generate the PWM clock signal based on the clock signal.

10. The LED package of claim 9, wherein the first pixel driving integrated circuit comprises:
a data input pad configured to receive the serial data;
a data output pad configured to output data, other than the first frame data, of the serial data;
a power pad configured to receive the source voltage;
a first clock pad configured to receive the clock signal; and
a ground pad connected to the plurality of first LED chips.

11. The LED package of claim 2, wherein the first frame data further comprises clock data, and
wherein the first pixel driving integrated circuit further comprises a clock generator configured to generate the clock signal and the PWM clock signal based on the clock data.

12. The LED package of claim 11, wherein the first pixel driving integrated circuit comprises:
a data input pad configured to receive the serial data;
a data output pad configured to output data, other than the first frame data, of the serial data;
a power pad configured to receive the source voltage; and
a ground pad connected to the plurality of first LED chips.

13. The LED package of claim 1, wherein the PWM data calculator is configured to perform a multiplication operation on the first frame data and the duty ratio compensation data in the first mode and an addition operation on the first frame data and the duty ratio compensation data in a in the second mode.

14. The LED package of claim 1, further comprising a package substrate disposed under the first pixel driving integrated circuit,
wherein the plurality of first LED chips are directly connected to the first pixel driving integrated circuit through at least one electrode,
wherein the first pixel driving integrated circuit is connected to the package substrate through at least one first bonding wire, and
wherein the plurality of first LED chips are directly connected to the first pixel driving integrated circuit through at least one second bonding wire.

15. The LED package of claim 1, further comprising a package substrate interposed between the plurality of first LED chips and the first pixel driving integrated circuit,
wherein the plurality of first LED chips are directly connected to the first pixel driving integrated circuit through at least one electrode, and the first pixel driving integrated circuit is connected to the package substrate through at least one conductive bump.

16. The LED package of claim 1, further comprising:
a second LED pixel including a plurality of second LED chips; and
a second pixel driving integrated circuit configured to drive the plurality of second LED chips based on the AM mode,
wherein the second pixel driving integrated circuit comprises:
a third storage area configured to store second frame data of each of the plurality of second LED chips;
a fourth storage area configured to store duty ratio compensation data of each of the plurality of second LED chips;
a PWM data calculator configured to perform an arithmetic operation on the second frame data provided from the third storage area and the duty ratio compensation data provided from the fourth storage area to generate PWM data; and
a PWM data generator configured to adjust an emission duty ratio based on the PWM data.

17. The LED package of claim 16, further comprising a package substrate disposed under the first pixel driving integrated circuit and the second pixel driving integrated circuit,
wherein the package substrate, the plurality of first LED chips, the first pixel driving integrated circuit, the plurality of second LED chips, and the second pixel driving integrated circuit are fixed by one sealing member.

18. A light-emitting diode (LED) package comprising:
a first LED pixel including a plurality of first LED chips;
a first pixel driving integrated circuit configured to drive the plurality of first LED chips based on an active matrix (AM) pulse width modulation (PWM) mode of controlling a time for which a driving current is applied thereto in a first frame period; and
a package substrate on which the plurality of first LED chips and the first pixel driving integrated circuit are disposed,
wherein the first pixel driving integrated circuit comprises:
a deserializer configured to receive serial data from an external controller, extract and store first frame data of each of the plurality of first LED chips from the serial data, and provide the first frame data;
a first storage area configured to store the first frame data provided from the deserializer;
a second storage area configured to store duty ratio compensation data of each of the plurality of first LED chips;
a PWM data calculator, connected between the plurality of first LED chips and the deserializer, configured to perform an arithmetic operation on the first frame data provided from the first storage area and the duty ratio compensation data provided from the second storage area to generate PWM data;
a constant current generator configured to generate a reference current based on a source voltage;
a PWM data generator configured to generate a plurality of first driving currents applied to the plurality of first LED chips based on a clock signal, a PWM clock signal, the PWM data provided from the PWM data calculator, and the reference current provided from the constant current generator;
a data input pad configured to receive the serial data;
a data output pad configured to output data, other than the first frame data, of the serial data;

a power pad configured to receive the source voltage;
a first clock pad configured to receive the clock signal;
a second clock pad configured to receive the PWM clock signal; and
a ground pad connected to the plurality of first LED chips,
wherein the PWM data calculator is configured to perform a first arithmetic operation on the first frame data and the duty ratio compensation data in a first mode and a second arithmetic operation on the first frame data and the duty ratio compensation data in a second mode, and
wherein the first arithmetic operation and the second arithmetic operation are different.

19. A display apparatus comprising:
a printed circuit board;
a plurality of light-emitting diode (LED) packages disposed on a first surface of the printed circuit board; and
a controller disposed on a second surface opposite to the first surface of the printed circuit board, the controller being configured to control driving of the plurality of LED packages,
wherein each of the plurality of LED packages comprises:
a first LED pixel including a plurality of first LED chips; and
a first pixel driving integrated circuit configured to drive the plurality of first LED chips based on an active matrix (AM) mode using entirety of a first frame period, and
wherein the first pixel driving integrated circuit comprises:

a first storage area configured to store first frame data of each of the plurality of first LED chips;
a second storage area configured to store duty ratio compensation data of each of the plurality of first LED chips;
a pulse width modulation (PWM) data calculator configured to perform an arithmetic operation on the first frame data provided from the first storage area and the duty ratio compensation data provided from the second storage area to generate PWM data;
a PWM data generator configured to adjust an emission duty ratio based on the PWM data; and
a deserializer configured to receive serial data from an external controller, extract and store the first frame data of each of the plurality of first LED chips from the serial data, and provide the first frame data to the first storage area,
wherein each of the PWM data calculator and the PWM data generator is connected between the plurality of first LED chips and the deserializer,
wherein the PWM data calculator is configured to perform a first arithmetic operation on the first frame data and the duty ratio compensation data in a first mode and a second arithmetic operation on the first frame data and the duty ratio compensation data in a second mode, and
wherein the first arithmetic operation and the second arithmetic operation are different.

* * * * *